US006710343B2

(12) United States Patent
Wood et al.

(10) Patent No.: US 6,710,343 B2
(45) Date of Patent: Mar. 23, 2004

(54) PHOTON DETECTOR

(75) Inventors: Kent S. Wood, Chevy Chase, MD (US); Gilbert G. Fritz, Alexandria, VA (US); Armen M. Gulian, Ashton, MD (US); Deborah Van Vechten, Ashton, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 141 days.

(21) Appl. No.: 09/813,858

(22) Filed: Mar. 22, 2001

(65) Prior Publication Data

US 2001/0042831 A1 Nov. 22, 2001

Related U.S. Application Data

(60) Provisional application No. 60/191,127, filed on Mar. 22, 2000.

(51) Int. Cl.$^7$ .................................................. G01J 5/00
(52) U.S. Cl. .................................................. 250/338.1
(58) Field of Search .......................... 250/338.1; 338/18

(56) References Cited

U.S. PATENT DOCUMENTS

| | | | | |
|---|---|---|---|---|
| 3,748,479 A | * | 7/1973 | Lehovec | 250/208.1 |
| 4,266,008 A | * | 5/1981 | Kampwirth et al. | 430/318 |
| 4,691,973 A | * | 9/1987 | Rosheim | 439/161 |
| 5,296,458 A | * | 3/1994 | Himpsel | 505/473 |
| 5,880,468 A | | 3/1999 | Irwin et al. | 250/336.2 |
| 6,177,673 B1 | * | 1/2001 | Blomberg et al. | 250/339.01 |

OTHER PUBLICATIONS

D. Van Vechten, K. Wood, G. Fritz, J. Horwitz, A. Gyulamiryan, A. Kuzanyan, V. Vartanyan, A. Gulian, "Imaging Detectors based on Anisotropic Thermoelasticity", Nuclear Instruments and Methods in Physics A 444 (2000) 42–45. Publication date Apr. 11, 2000.

D. Van Vechten, K. Wood, G. Fritz, A. Gyulamiryan, V. Nikogosyan, N. Giordano, T. Jacobs, A. Gulian, "Thermoelectric Single Photon Detectors: Isotropic Seebeck Sensors" IEEE 18$^{th}$ International Conference on Thermoelectrics (1999), pp. 477–480.

A.M. Gulian, D. Van Vechten, K.S. Wood, G.G. Fritz, J. Horwitz, M.S. Osofsky, J.M. Pond, S.B. Qadri, R.M. Stroud, J.B. Thrasher, V. Vartanyan, A.S. Kuzanyan, V.R. Nikogosyan, A.L. Gyulamiryan, "Imaging Detectors based on the Response of Anisotropic Layered Materials", IEEE Transactions on Applied Superconductivity, Vol 9, No. 2, Jun. 1999, pp. 3194–3197.

(List continued on next page.)

*Primary Examiner*—Constantine Hannaher
*Assistant Examiner*—Shun Lee
(74) *Attorney, Agent, or Firm*—John J. Karasek; John Gladstone Mills, III

(57) ABSTRACT

A fast photon detector with high energy and position resolution, which may be used in the infrared, ultraviolet, EUV, and X-ray ranges includes an absorber, a thermoelectric sensor, a heat sink, all disposed on a dielectric substrate. An absorber receives a photon and transforms the energy of the photon into a change in temperature within the absorber. A thermoelectric sensor is thermally coupled to the absorber. When the absorber receives the photon, the energy of the photon is very quickly transformed into a time dependent temperature difference across the sensor. A heat sink is thermally coupled to the sensor, to maintain the heat flow across the sensor. The absorber, sensor, and heat sink are disposed upon a dielectric substrate, such that the heat transfer from the sensor to the dielectric substrate is much slower than the signal duration.

29 Claims, 12 Drawing Sheets

OTHER PUBLICATIONS

G.G. Fritz, K.S. Wood, D. Van Vechten, A.L. Gyulamiryan, A.S. Kuzanyan, N. Giordano, T.M. Jacobs, H.-D. Wu, J.S. Horwitz, A.M. Gulian, "Thermoelectric Single–Photong Detectors for X–ray/UV Radiation", X–Ray and Gamma Ray Instrumentation for Astronomy XI, K.A. Flanagan, O.H.W. Siegmund, eds., Proc. SPIE Vol 4140 (Aug. 2000), 459–469.

E.V. Osipov, A. Aulas, "Nature of Thermoelectric Anisotropy in Semiconductors at the lower temperatures", IEEE 16th International Conference on Thermoelectrics (1997) p 757–760.

A.J. Miller, B. Cabrera, R.M. Clarke, E. Figueroa–Fleliciano, S. Nam, R.W. Romani, "Transition Edge Sensors as Single Photon Detectors", IEEE Transactions on Applied Superconductivity, Vol 9, No. 2, Jun. 1999, pp. 4205–4208.

K.D. Irwin, S.W. Nam, B. Cabrera, B. Chugg, G.S. Park, R.P. Welty, J.M. Martinis, "A Self–Biasing Cryogenic Particle Detector Utilizing Electrothermal Feedback and a SQUID Readout", IEEE Transactions on Applied Superconductivity, Vol 5, No. 2, Jun. 1995, pp. 2690–2693.

* cited by examiner

PHOTON DETECTOR

This application claims priority to U.S. provisional patent application No. 60/191,127 filed on Mar. 22, 2000.

BACKGROUND OF THE INVENTION

1. Field of the Invention

The invention is in the field of devices called microbolometers, and specifically, is a microbolometer for detecting photons in the infrared, ultraviolet, EUV, and X-ray ranges.

2. Description of the Prior Art

Several currently available systems are used to detect single photons in the infrared, ultraviolet, EUV, and X-ray ranges. A Transition Edge Sensor based (TES) microbolometer is described in U.S. Pat. No. 5,880,468 to Irwin and in A. J. Miller et al, "Transition Edge Sensors as Single Photon Detectors", IEEE Transactions on Applied Superconductivity, Vol 9, No. 2, pages 4205–4208, June 1999. The TES based microbolometer consists of 3 separate parts: a metallic absorber, which transforms the energy of the single photon into heat in a normal-metal base layer, which transmits the heat to the thermometer; and the thermometer (the TES) itself.

Current TES systems have four inherent problems limit their effectiveness. First, four electric leads are needed for each pixel, making it difficult to arrange a large number of pixels close together in an array. Secondly, the sensors are currently placed on membranes, and sometimes even kept out of contact with the substrate by a pop up arrangement, which makes the system vulnerable to mechanical damage. Thirdly, the fraction of the focal plane area devoted to the absorber is small, so the spatial efficiency of the devices is limited. In addition, power must be continuously supplied to the TES for the read-out to occur and to keep the TES substantially warmer than the substrate if event rates of even 1 kHz are to be achieved. Fourthly, the operational temperature is very low, typically bias temperatures are below 100 $\mu$K. For these reasons, many important practical imaging applications are difficult to achieve.

Other devices for detecting photons include cooled integrating Charge Coupled Device (CCD) digital imaging systems. Although CCDs have better focal plane area utilization than TES systems, and are available in large array format, CCDs have very limited energy resolution capability. Modern semiconducting CCD detectors have already achieved efficiencies in excess of 90% of their theoretical limit with excellent spatial resolution, but are limited in their temporal resolution by the long read-out time per pixel. More importantly, their non-dispersive spectral resolution is limited statistically so that $\Delta E_{FWHM}$ cannot exceed the level of about 100 eV for E=6 KeV photon events.

The other main class of detector, superconducting tunnel junctions (STJ), are not bolometers and have never functioned as well as the bolometers, especially at high energy ranges (X-ray). Examples of STJs are described in P. Verhoeve, N. Rando, A. Peacock, A. van Dordrecht, M. Bavdaz, J. Verveer, D. J. Goldie, M. Richter, and G. Ulm, Proc. Int. Workshop LTD-7 (Ed. S. Cooper), Munich, 1997, pp. 97–100.

Energy-dispersive broadband detectors which are easily integrated into a detector array are desired for both space research and laboratory instrumentation. The next generation of single-photon detectors will need to be hyperspectral imaging detectors capable of obtaining high spectral resolutions (up to $E/\Delta E_{FWHM}$=10,000 for E=1–6 KeV x-ray photon events and $\lambda/\Delta\lambda$>100 for UV photons) and processing high event rates, while maintaining high spatial resolution and high focal plane efficiency. For hyperspectral imagers, a new class of detectors is needed. Thermoelectric hot-electron microcalorimeters have been proposed for use as photon detectors (D. Van Vechten, K. S. Wood, G. G. Fritz, A. L. Gyulamiryan, V. Nikogosyan, N. Giordano, T. Jacobe, and A. M. Gulian, "Thermoelectric Single-Photon Detectors: Isotropic Seebeck Sensors", 18th International Conference on Thermoelectrics, pp. 477–480 (1999)), and G. G. Fritz, K. S. Wood, D. Van Vechten, A. L. Gyulamiryan, A. S. Kuzanyan, N. J. Giordano, T. M. Jacobs, H. D. Wu, J. S. Horwitz, A. M. Gulian, "Thermoelectric single-photon detectors for X-ray/UV radiation"; X-Ray and Gamma-Ray Instrumentation for Astronomy XI, Proc. SPIE, Vol 4140, (2000), the disclosures of which are incorporated herein by reference.

Photon detectors using materials which are strongly thermally anisotropic have been proposed in A. M. Gulian, D. Van Vechten, K. S. Wood, G. G. Fritz, J. S. Horwitz, M. S. Osofsky, J. M. Pond, S. B. Qadri, R. M. Stroud, J. B. Thrasher, "Imaging Detectors Based on the Response of Anisotropic Layered Materials", IEEE Trans. Applied Superconductivity, Vol. 9, No. 2, pp. 3194–3197, (1999) and in D. Van Vechten, K. S. Wood, G. G. Fritz, J. Horwitz, A. L. Gyulamiryan, A. Kuzanyan, V. Vartanyan, and A. M. Gulian, "Imaging Detectors based on anisotropic thermoelectricity", Nuclear Instruments and Methods in Physics Research section A, 444 (2000)42–45 both of which are incorporated by reference. Advantages of these novel approaches are numerous.

SUMMARY OF THE INVENTION

An object of the invention is to provide a photon detector which requires no applied voltage or current for sensor operation.

An object of the invention is provide a photon detector with high photon efficiency and high spectral resolution, with an improved temporal response.

An object of the invention is to provide a photon detector with sufficiently fast temporal response time to detect photons arriving at a rate of 1,000,000 per second in each detector unit.

Another object of the invention is to provide a spatially efficient photon detector where the absorbers intercept a large fraction of the incident photons which is easily and efficiently integrated into a photon detector array.

In accordance with these and other objects which will become apparent, the invention described herein is a fast photon detector with high energy and position resolution, which may be used in the infrared, ultraviolet, EUV, and X-ray ranges. An absorber receives a photon and transforms the energy of the photon into a change in temperature within the absorber. A thermoelectric sensor is thermally coupled to the absorber. When the absorber receives the photon, the energy of the photon is very quickly transformed into a time dependent temperature difference across the sensor. A heat sink is thermally coupled to the sensor, to maintain the heat flow across the sensor. The absorber, sensor, and heat sink are disposed upon a dielectric substrate, such that the heat transfer from the sensor to the dielectric substrate is much slower than the signal duration. Superconducting leads are used to measure the voltage which develops across the sensor in response to a photon event. The superconducting leads may be attached to the input coil of a SQUID flux transformer circuit.

In one embodiment of the invention, a superconducting bridge is disposed upon the substrate between the absorber and the heat sink, at a distance from the contact with the sensor. The superconducting bridge allows the absorber-sensor-heat sink-superconductor to act as a current loop, which generates a measurable flux.

In another main embodiment, an isotropic, thin superconducting oxide film is disposed upon a dielectric substrate. The superconducting oxide film acts as a thermoelectric sensor, and absorbs photons. A large voltage response across the longitudinal direction of the sensor results from the temperature gradient between the top of the sensor and the dielectric substrate, which acts as a heat sink. In another embodiment, an absorber and an optional insulating layer are disposed upon and thermally coupled to the thin semi-conducting oxide film to ensure complete absorption of all incident photons.

DETAILED DESCRIPTION OF THE INVENTION

I. Single and Double Pixel Photon Detectors

Figure 1:
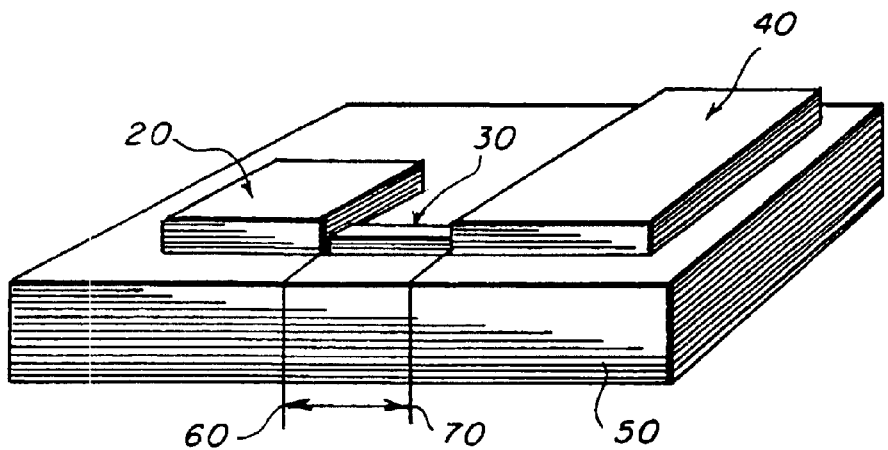
FIG. 1 is an illustration of a single pixel photon detector according to the invention.

Refer first to FIG. 1, which illustrates a photon detector according to the invention. An absorber 20, a sensor, 30, and a heat sink 40 are disposed upon a substrate 50. The absorber 20 is thermally coupled to the sensor 30, and the sensor 30 is thermally coupled to the heat sink 40. The absorber 20 receives a photon with an energy that should be measured. The photon is absorbed in the absorber 20, causing the absorber to rapidly increase in temperature and to become warmer than the heat sink 40. The heat flowing from the absorber 20 to the heat sink 40 through the sensor 30 generates a Seebeck electromotive force across the sensor 30 between the absorber 20 and the heat sink 40. The Seebeck electromotive force (either the thermoelectric voltage across the sensor or the current flowing in the sensor) is measured by measurement devices (not shown) attached to leads 60 and 70 which are attached to the absorber and the heat sink, respectively. The time integral of the thermoelectric voltage is directly proportional to the deposited energy of the received photon in the absorber 20. This allows the energy of the absorbed quantum to be easily and accurately determined.

The sensor 30 is metallic thin film which is a normal state metal at operating temperatures. The substrate 50 is a dielectric material such as sapphire. The sensor 30, absorber 20, and heat sink 40 are maintained at an operating temperature T.

After a photon is absorbed by the absorber 20, over a short period time $\tau_{signal}$, the heat in the absorber 20 flows through the sensor 30 into the heat sink 40. Because of the large Kapitza resistance between the metal of the absorber 20 and the dielectric material of the substrate 50 as well as between the heat sink 40 and the substrate 50, heat from the absorber 20 (and heat sink 40) flows to the dielectric substrate 50 much more slowly than it flows between the absorber 20 and the heat sink 40. The time period required for the sensor to reset itself for arrival of another photon is the time required for the absorber 20 to return to its initial temperature (that is, the cool temperature T when it is unexcited by a photon). This resetting time, $\tau_K$, should be substantially longer than the signal duration time, $\tau_{signal}$ ($\tau_K >> \tau_{signal}$).

The desired relationship between the time scales $\tau_K$ and $\tau_{signal}$ is satisfied if the resistance R satisfies the inequality $R < r_0 L_0/(T^2 A_{abs})$, where $r_0$ is the Kapitza resistance constant between the absorber and the dielectric substrate (typically $r_0$ is approximately equal to 20 $K^4$ $cm^2/W$), $A_{abs}$ is the surface area of the interface between the absorber 20 and the substrate 50, T is the operating temperature (i.e. the bias temperature of the sensor) on the Kelvin temperature scale, $L_0$ is the Lorenz number, and R is the resistance of the circuit (including the sensor and the boundaries of the sensor with the absorber and with the heat sink). For superconducting leads, and with good connections, the circuit resistance R will primarily be made up of the resistance of the sensor 30. The Lorenz number is approximately 25 nW-$\Omega/K^2$, as discussed in, for example, O. V. Lounasmaa, Experimental Principles and Methods below 1 K, Acad. Press, London, 1974 (pp 243–284).

The size and shape of the sensor is selected to ensure that the resistance of the sensor is in the appropriate range. The sensor has electrical resistance $R=L/(A\sigma)$, where L is the length of the sensor between the absorber and the heat sink, A is the cross sectional area of the sensor, and $\sigma$ is the electrical conductivity of the sensor material.

For thin deposited films the experimentally measured Kapitza resistance depends on the absorber thickness $d_{abs}$, since the excess energy is proportional to the absorber volume $V_{abs}$, and the energy transfer occurs through the interface between the absorber and the substrate, which has surface area $A_{abs}$.

The desired value of $\tau_K$ is estimated by the relationship $\tau_K T^3 A_{abs}/C_{abs}=r_0$, where $r_0$ is approximately equal to 20 $K^4$ $cm^2$/W, $A_{abs}$ is the surface area of the interface between the sensor and the substrate, $C_{abs}$ is the absorber heat capacity.

Measuring the voltage across the sensor 30 is necessary for obtaining information about the energy of the received photon. The voltage response is explained by the following discussion:

After a photon event (arrival), the temperature of the absorber is $$T^*(t)=T+\delta T(t), \quad (1)$$

where T is the temperature of the heat sink (equal to the temperature of the absorber prior to a photon event), and $\delta T(t)$ is the temperature excursion in the absorber due to a photon event. The maximum value $\delta T(t)$ will reach is $\delta T(t)_{max}$, which is equal to $Q/C_{abs}$, where Q is the deposited photon energy and $C_{abs}$ is the absorber heat capacity.

For an isotropic sensor the Seebeck voltage which develops across the sensor is $$V(t)=\int S(T)\nabla T(t)\cdot dl \quad (2)$$

integrated over a line between the absorber 20 and the heat sink 30, where dl is a differential line element across the sensor, S is the Seebeck coefficient, and $\nabla T(t)$ is the gradient of the temperature in the sensor. Then, the Seebeck voltage due to the photon arrival is equal to $$V_{signal}(t)=\int_T^{T^*(t)} SdT=S\delta T(t) \quad (3)$$

where at t=0, $V_{signal}=QS/C_{abs}$, where $C_{abs}$ is the absorber heat capacity.

Ignoring for a moment the heat flow between the sensor and the substrate, the duration of the voltage signal is approximately $$\tau_{signal}=C_{abs}/G_S, \quad (4)$$

where $G_S$ is the heat conductance of the sensor. The heat conductance of the sensor $G_S$ is dependent upon the geometry of the sensor, and is equal to $$G_s=kA/L, \quad (5)$$

where A is the cross sectional area of the sensor, L is the length of the sensor between the absorber and the heat sink, and k is the heat conductivity of the sensor.

The electrical leads 60 and 70 are coupled to an external voltage measuring device. The voltage measuring device (typically semiconductor electronics) used for this embodiment typically relies on a SQUID-array amplifier with a flux transformer, due to its sensitivity to low flux and responsiveness.

When the temperature is low (below about 1 K), the electrons and phonons are effectively decoupled, the phonon contribution to the heat conductivity k is negligible, and the relationship between the heat conductivity k and the electrical conductivity of the sensor is $k/\sigma=L_0T$, where $L_0$ is the Lorenz number (approximately equal to 25 nW-$\Omega/K^2$).

The signal duration is therefore approximated by the relationship $$\tau_{signal}=(C_{abs}R)/(L_0T). \quad (6)$$

The material properties of the detector, the geometry, and the temperature of the system will therefore determine the minimum signal duration which may accurately be measured.

Materials which have some variation in their properties based on direction (anisotropic materials) may be used for this sensor if they have a large Seebeck coefficient in the direction parallel to the temperature gradient.

In order to maximize the spectral resolution of this or any photon detector, it is desirable to keep the signal to noise ratio to a minimum. The noise of this system will be kept to a minimum in order to reduce the signal to noise ratio and to increase the detector's spectral resolution, as will be shown by the following analysis:

The Johnson noise contributed by the sensor itself is the inherent voltage noise of the sensor, according to:

$$V_{JN}=(4k_BTR\delta\upsilon)^{1/2}, \quad (7)$$

where $\delta\upsilon$ is the measurement bandwidth typically taken as equal to $1/(4\tau_{signal})$. Since, from equation (6) above, $\tau_{signal}=(C_{abs}R)/(L_0T)$, the inherent voltage noise of the sensor is $$V_{JN}=(k_BTRkA/LC_{abs})^{1/2}. \quad (8)$$

The equivalent Johnson noise term can be determined by converting the $V_{JN}$ into r.m.s. energy variance units, as $$\{<(\delta E_{JN})^2>\}^{1/2}=(ZT)^{-1/4}[(k_BT)(C_{abs}T)]^{1/2}, \quad (9)$$

where $Z=S^2\sigma/k$ is a figure of merit parameter commonly used in studies of thermoelectric materials.

Other noise sources are now considered. For a thermally insulated absorber, the noise associated with thermal fluctuations of the absorber temperature $\{<(\delta E)^2>\}^{1/2}=0$. If, however, there is a thermal coupling between the absorber and the external environment, the spectral density of noise equivalent power (NEP) is given by $4k_BT^2G$, where G is the heat conductance between the absorber and the external world. If this thermal coupling is between the absorber and the substrate, then the $4k_BT^2G$ noise is called the "phonon noise". The r.m.s. energy variance is therefore given by $$\{<(\delta E_{fl})^2>\}^{1/2}=\tau[(4k_BT^2G\delta\upsilon)]^{1/2}, \quad (10)$$

where $\tau$ is the fluctuational energy exchange time, which is estimated by $\tau=C_{abs}/G$, and $\delta\upsilon$ is the measurement bandwidth typically taken as equal to $1/(4\tau_{signal})$.

The noise bandwidth is restricted by $1/\tau$, so substituting $\delta\upsilon=1/(4\tau_{signal})$ into the equation above yields $$\{<(\delta E_{fl})^2>\}^{1/2}=[(k_BT^2C_{abs})]^{1/2}, \quad (11)$$

which is the thermodynamic value of the energy fluctuations within the absorber of given heat capacity in case of unrestricted energy exchange with the equilibrium environment. For such a thermal coupling between the absorber and the equilibrium environment, the energy variance is coupled with the inherent thermodynamic fluctuations of temperature, as $$\{<(\delta T_{fl})^2>\}^{1/2}=\{k_BT^2C_{abs}\}^{1/2}, \quad (12)$$

so that $$\{<(\delta E_{fl})^2>\}^{1/2}=C_{abs}\{<(\delta T_{fl})^2>\}^{1/2}, \quad (13)$$

as discussed in L. D. Landau and E. M. Lifshitz, Statistical Physics 9, Vol.5, Part. 1, Pergammon Press, 3ed, New York, 1980, p 340. This relationship identifies the absorber and heat sink as two parts of a total, thermodynamic equilibrium system.

The substrate-related "phonon" noise is denoted as $\{<(\delta T_{pn})^2>\}^{1/2}$ in an r.m.s. energy variance form. The phonon noise is "switched on" by the arrival of a phonon at the absorber from the substrate and subsequent temperature rise in the absorber, with a Kapitza boundary at the boundary between the absorber and the dielectric substrate. The time scale for energy escape through the Kapitza boundary between the absorber and the dielectric substrate is denoted by $\tau_K$. As discussed above, the time scale $\tau_K$ should be substantially longer than the signal duration $\tau_{signal}$.

Note that the experimentally measured Kapitza resistance for thin films on dielectric substrates is often larger by a factor of approximately three than the theoretical value. This lengthens the timescale $\tau_K$ by the same threefold factor, which is favorable. When $\tau_k$ is much greater than $\tau_{signal}$, the bandwidth of the energy flow through the Kapitza boundary is much smaller than the operational bandwidth of the sensor. So for the sensor described above, at $\tau=\tau_{signal}$, the phonon noise $$\{<(\delta E_{pn})^2>\}^{1/2} \approx \{k_B T^2 C_{abs}\}^{1/2}(G_K/G_S) << \{<(\delta E_{fl})^2>\}^{1/2}. \quad (14)$$

This confirms that the phonon noise caused by the energy exchange of the absorber with the substrate is negligible.

Figure 2:
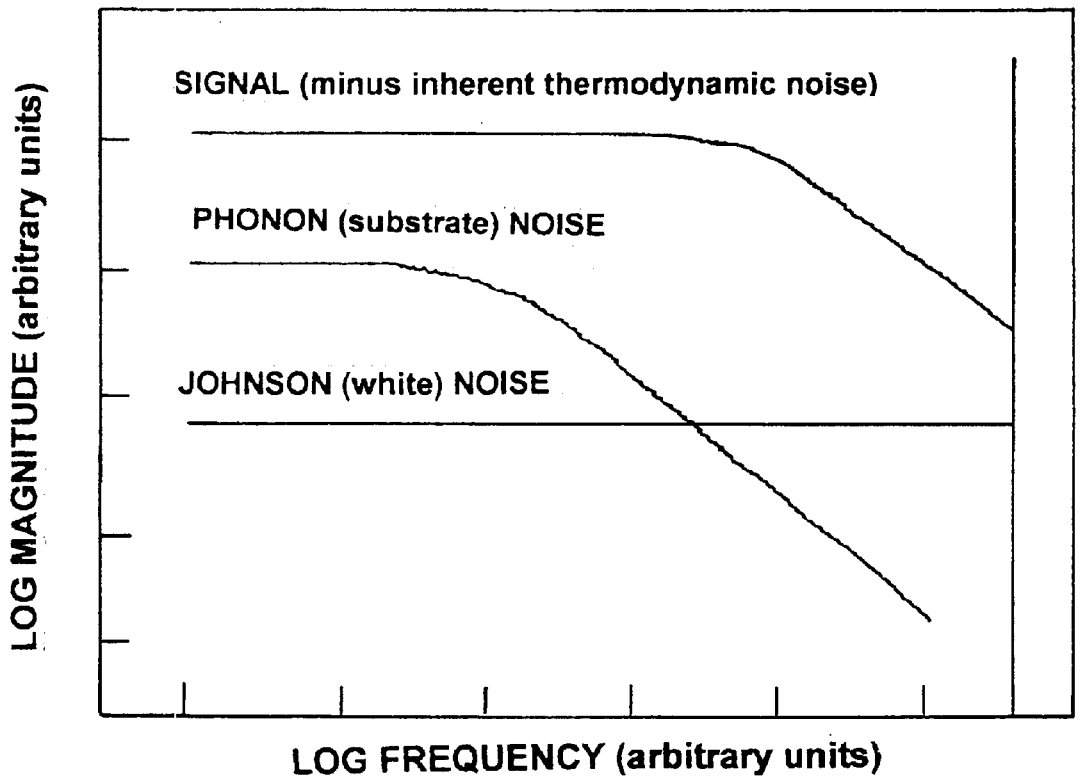
FIG. 2 is a log—log plot of noise versus frequency comparing the noise of thermal energy fluctuations and the Johnson noise with the signal in photon detector according to the invention.

FIG. 2 compares the re-normalized signal (thermodynamic fluctuations between the absorber and heat sink are subtracted) generated by a photon detector according to the invention with the phonon (substrate) noise and the Johnson (white) noise. The characteristic time scale for the energy exchange with the substrate is set up by the Kapitza time $\tau_k$. This causes a signal bandwidth to be much larger than the substrate noise bandwidth, so that devices can be coupled directly on the substrates.

In summary, it is advantageous that the signal duration $\tau_{signal}$ is less than $\tau_K$ for several reasons. First, it is desired that the heat distribution throughout the absorber be homogeneous and fast. Second, the heat should flow through the sensor to the heat sink much faster than it flows into the substrate. Third, it is desired to reduce the noise associated with the heat flow ($\delta E_{fl}$).

Figure 3:
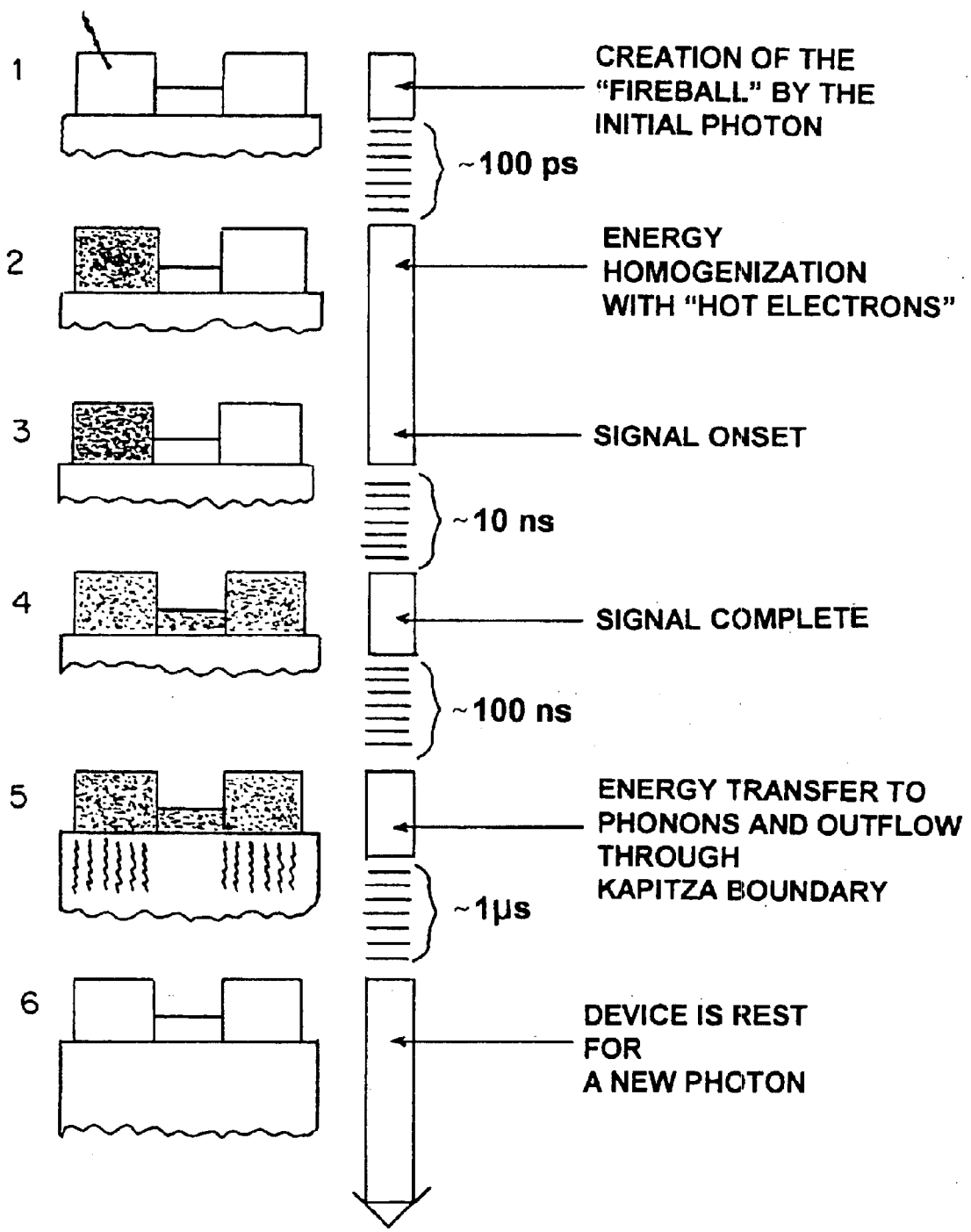
FIG. 3 illustrates the sequence of events in the photon detector following arrival of a photon.

FIG. 3 illustrates the conditions in the absorber, sensor, and heat sink after arrival of a photon. In step 1, a "fireball" is created by the initial photon. At step 2, after approximately 100 ps, energy is homogenized within hot electrons in the absorber. At step 3, the signal arises as the heat transfer begins to move into the sensor. After a signal duration of approximately 10 ns, at step 4, the heat transfer and signal are complete. After approximately 100 ns (for typical systems) at step 5, the energy transfer to phonons and starting outflow through the Kapitza boundary between the absorber and the substrate and the heat sink and the substrate begins. After approximately 1 µs, at step 6, energy transfer to the substrate is complete and the device is ready for arrival of a new photon.

The maximum counting rate of the pixel (absorber-sensor-heat sink) is determined by the value of $\tau_K$. For a 1 micron (1 µm) metal film on a dielectric substrate at a temperature of approximately T=0.3 K, $\tau_K$ is shorter than 1 microsecond (1 µs), which allows counting rates per pixel approaching $10^6$ photons per second. This is a great improvement over the counting rates of currently available microbolometers, which are limited to about $10^4$ photons per second.

Sensor and Absorber Materials

The optimal sensor materials are those with a thermoelectric figure of merit ZT greater than approximately one (ZT>1) in the operating temperature range. Kondo metals such as Lanthanum-Cerium Hexaboride ($La_{1-x}Ce_xB_6$, where x=0.01) thin films have a Seebeck coefficient S of approximately 120 µV/K at temperatures of less than 1 K, so the figure of merit ZT~1 is expected even at sub-K temperatures if $k_{ph}<k_e$, where $k_{ph}$ is the phonon heat conductivity and $k_e$ is the electron heat conductivity. Since, in Equation (9), the ZT contribution is $(ZT)^{-1/2}$, even if the sensor material is not optimal, the degradation in performance will not be crucial. For example, even if there is a 100-fold degradation in ZT, the energy resolution is only reduced by a factor of 10, so the device will still compare well with TES and STJ detectors. Other metals which may be used as sensors include Kondo alloys such as (Au,Fe) or (Au,Mn), although these alloys have Seebeck coefficients less than the hexaborides.

Table 1 illustrates the electron-phonon interaction time in some potential absorber metals at low temperatures. These values were measured using the RFSE technique discussed in Johnson, P. B. and Goodrich, R. G, "Anisotropy of the electron-phonon collision frequency on the Fermi surface of silver", Phys. Rev. Lett, Vol. 14, No. 8 (1976), pp. 3286–3295, among others. The values of $\tau_{e-ph}$ for Ag, Au, and Sb are proportional to $T^3$ and for $\tau_{e-ph}$ is proportional to $T^2$ for W. Typical times for these metals are tens of nanoseconds at a temperature of 1 K and hundreds of nanoseconds at a temperature of 0.3 K. If the pulse duration (the heat transfer across the sensor) is shorter than these times, then a single photon sensor according to the invention will benefit from electron-phonon decoupling enhancement of the effective ZT.

TABLE 1

| Metal | $\tau_{e-ph}$ at 1 K, µs | $\tau_{e-ph}$ at 0.3 K, µs |
|---|---|---|
| Ag | 0.09–1.1 | 2.4–30 |
| Au | 0.05–0.07 | 1.4–1.9 |
| W | 0.05 | 0.5 |
| Sb | 0.01–0.1 | 0.27–2.7 |

Table 2 illustrates the thermal properties of some possible absorber materials. The data in Table 2 are based on information in C. Kittel, Introduction to Solid State Physics, $4^{th}$ ed, 1971; D. A. Papaconstantopoulis, Handbook of the Band Structure of Elemental Solids, 1986; and the Handbook of Chemistry and Physics (CRC), $76^{th}$ ed, 1996. The very complicated character of the electron-phonon interaction, as well as the anisotropy causes the large uncertainty for the case of semi-metals As, Sb, and Bi. For Sb absorbers, $C_{abs}$ is approximately equal to 2 fJ/K, so the absorber volume $V_{abs}$ must be about 220 to 1200 µm³. Note that the large uncertainty in volume is due to the large uncertainty in Sommerfeld's constant γ, where $\gamma=C_{abs}/V_{abs}T$. Although antimony has a smaller absorption than gold at higher energies, and correspondingly lower quantum efficiency at the same absorber thickness, it is suitable for low and intermediate energy photons and can provide larger pixel sizes at the same resolution level or higher resolution at the small pixel sizes. Bismuth is also a good candidate for an absorber. It has about ten times lower heat capacity than Sb and thus can yield larger pixel sizes.

TABLE 2

| metal, Z | $C_v^{el} = \gamma^{el} T$ @ 1 K [$\mu$J cm$^{-3}$ K$^{-1}$] | $C_v^{tot}$, @ 1 K [$\mu$J cm$^{-3}$ K$^{-1}$] | $C_v^{el} = \gamma^{el} T$ @ 0.3 K [$\mu$J cm$^{-3}$ K$^{-1}$] | $C_v^{tot}$, @ 0.3 K [$\mu$J cm$^{-3}$ K$^{-1}$] | $V_{abs}$ yielding $C_{abs}^{tot}$ = 1fJ/K @ 0.3 K, [$\mu$m$^3$] |
|---|---|---|---|---|---|
| Be, 4 | 34–47 | 45 | 14 | 10–14 | 70–100 |
| As, 33 | 14 | | 4.2 | >22.7 | ~40 |
| Sb, 51 | 6–30 | | 1.8–9 | 10–14 | ~100 |
| Bi, 83 | 0.4–3 | 20 | 0.1–0.9 | 0.7–1.4 | ~1000 |
| Au, 79 | 60–80 | 120 | 18–27 | 20–30 | 30–50 |
| W, 74 | 140 | 140 | 40 | 40 | 25 |

Good materials for sensors include Kondo metals, such as gold (Au) with iron (Fe) impurities in approximately 10 to 100 ppm of Fe concentration. Gold (Au) with iron (Fe) impurities in approximately 10 to 100 ppm of Fe concentration is expected to have a Seebeck coefficient S of about 6 $\mu$V/K at 300 mK.

An even better sensor material is $La_{1-x}Ce_xB_6$. A sensor made of a single crystalline sample of $La_{1-x}Ce_xB_6$ would have a resistivity value of $\rho$~3 $\mu\Omega$ cm at 300 mK, which translates into R=0.03 $\Omega$ for a 1 $\mu$m×1 $\mu$m×1 $\mu$m sensor element. A sensor 6 $\mu$m in length with a cross sectional area of 1 $\mu$m$^2$ will provide a resistance R of 0.2 $\Omega$ and a signal duration of about 10 nanoseconds (~10 ns) if the absorber has a $C_{abs}$ of 1 fJ/K at 300 mK. Of course, a sensor film of (La,Ce)$B_6$ will have larger resistivity values than for a single crystalline sample, but will make the sensor layout simpler by shortening or widening the sensor.

Figure 4A:
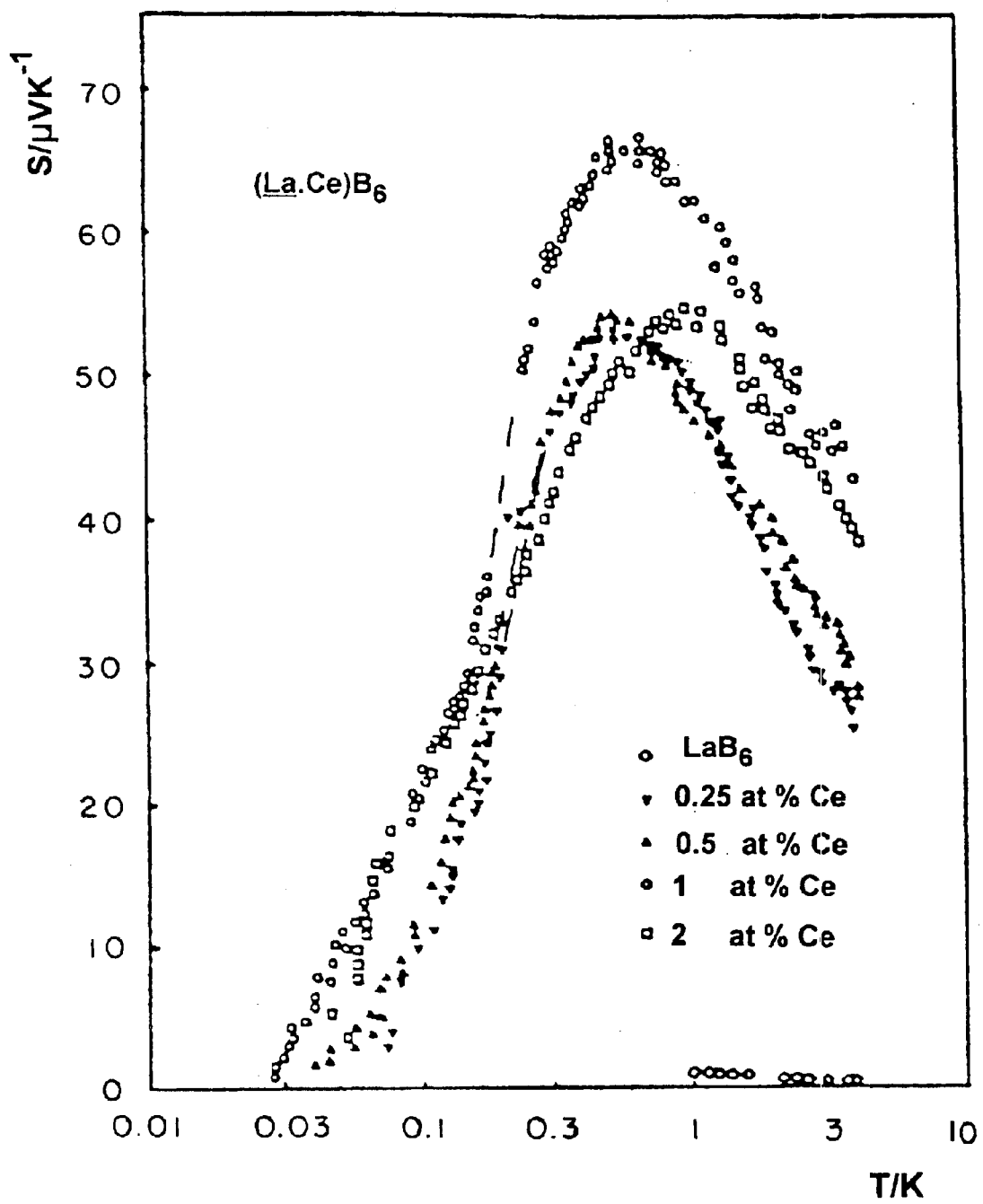
FIG. 4a is a plot of the measured Seebeck coefficient of $La_{1-x}Ce_xB_6$ with different concentrations (x) of Ce for use as a sensor in a photon detector according to the invention.

The measured Seebeck coefficient of bulk $La_{1-x}Ce_xB_6$ with different concentrations of Ce is shown in FIG. 4a. This figure has been excerpted from H. J. Ernst, H. Gruhl, T. Krug, and K. Winzer, "Specific Heat and Thermoelectric Power of (La, Ce) $B_6$", in: Proc 17$^{th}$ Int. Conf. LT-17 (Ed. U. Eckem, A. Schmid, W. Weber, and H. Wuhl, North-Holland, Amsterdam), vol 33, pt. 2, pp. 137–138 (1984). Notice that the Seebeck coefficient S is very high in the temperature range of 0.3 to 3 K. In fact, the (LaCe)$B_6$ samples have about ten times larger values of the Seebeck coefficient than Au—Fe in the <1 K bias temperature range.

In an example of an improvement based on (La,Ce)$B_6$ sensors, the (La,Ce)$B_6$ sensor has a Seebeck coefficient S of about 120 $\mu$V at 1 K, and a Seebeck coefficient of about 50–60 $\mu$V/K at 300 mK. This yields an energy resolution $\Delta E_{FWHM}$ of approximately 2.355 $\{<(\delta E)^2>\}^{1/2}$ <2 eV for up to keV incident photons at a bias temperature T=0.3 K using an absorber of specific heat 1fJ/K. The (La,Ce) hexaborides have about 10 times larger Seebeck coefficients than the Au—Fe sensors (at the bias temperatures below 1 K used for thermal noise reduction). This indicates that a gain of an order of magnitude in energy resolution will be achieved with a (La,Ce) hexaboride sensor. Moreover, this sensor material has about three times higher resistivity than Au—Fe sensors, so the duration of signal will be longer, the bandwidth $\upsilon_B$ will be lower, and the overall signal handling will be easier. The detector should be biased at about 300 mK. This is within the optimal range for high Seebeck coefficients S(T) for (La,Ce) hexaboride sensors. For this bias temperature, absorbers have $C_{abs}$ of about 0.25 fJ/K. This yields an energy resolution $\Delta E_{FWHM}$ of 1.0 eV. However, a 6 Kev photon deposits about 1 fJ, and it is desirable to keep the temperature rise small (~1 K), so a $C_{abs}$ in the range of 1 fJ/K is needed. This size will still deliver a resolution of $\Delta E_{FWHM}$ of 2.0 eV.

Figure 4B:
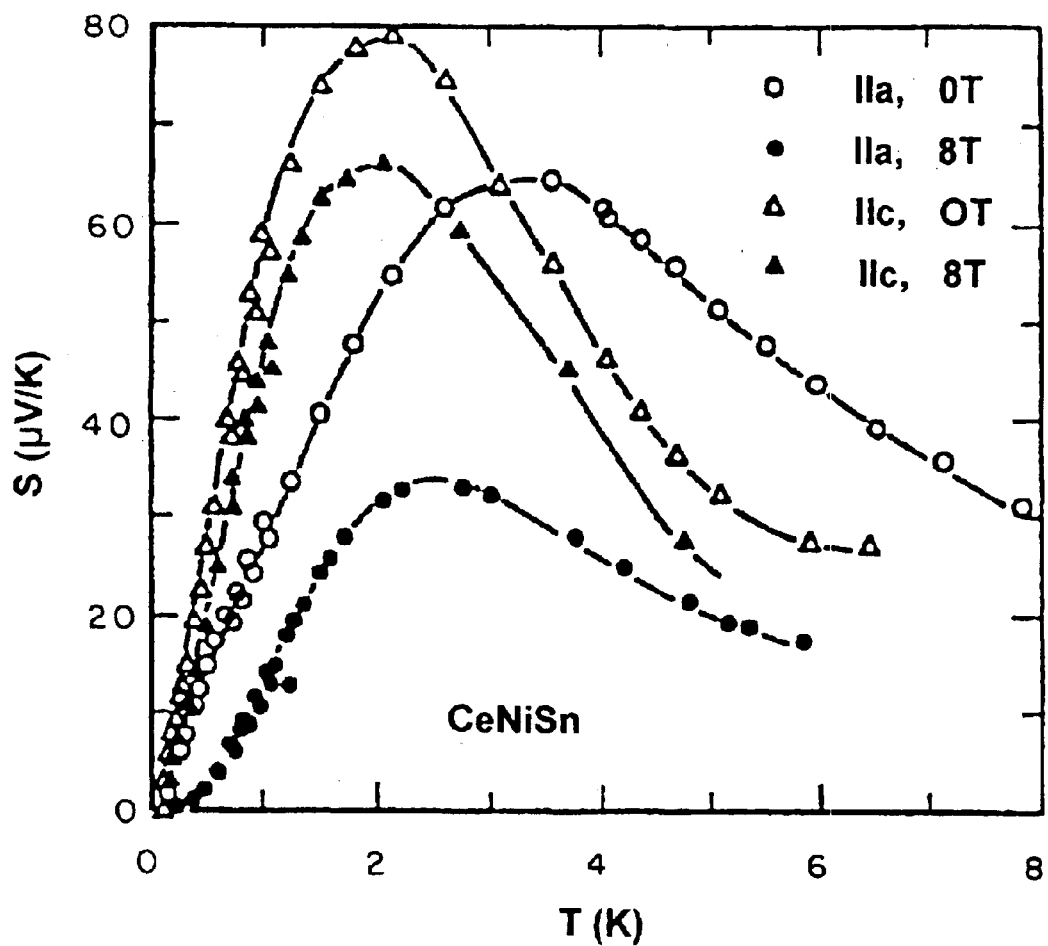
FIG. 4b is a plot of the measured Seebeck coefficient of CeNiSn at cryogenic temperatures for use in a sensor in a photon detector according to the invention.

Another excellent material for use as a sensor is (CeNiSn), which provides an extremely large thermoelectric effect at cryogenic temperature at both zero and non-zero magnetic fields. FIG. 4b is a plot of the Seebeck coefficient versus temperate for CeNiSn at cryogenic temperatures. Additional information is found in A. Hiess, C. Giebel, G. Sparn, C.D. Bredl, F. Steglich, T. Takabatake, H. Fujii, "Transport-properties of CeNiSn at low temperatures and in high magnetic fields", *Physica B*, Vol. 199, pp. 437–439, 1994, incorporated herein in its entirety.

Double Pixel Photon Detector

Figure 5:
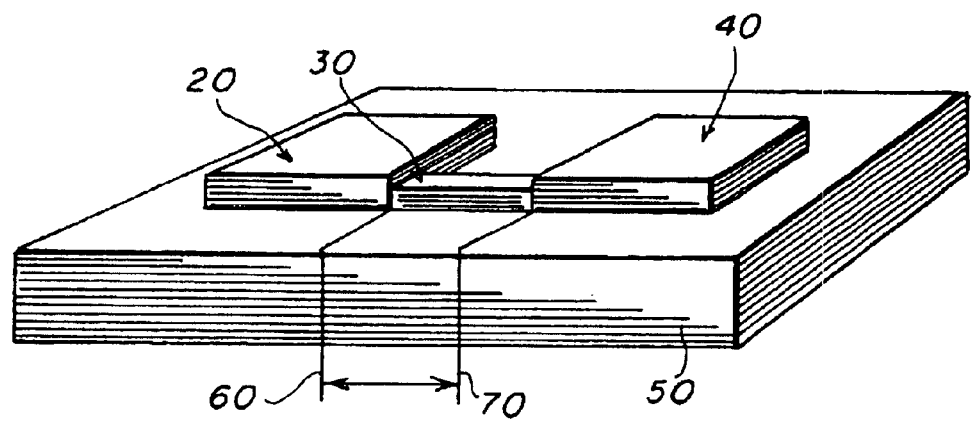
FIG. 5 is an illustration of a double pixel photon detector according to the invention.

Increased performance may be realized by using the double-pixel system shown in the embodiment illustrated in FIG. 5. This design allows the heat sink 40 to become a secondary photon absorber, and the absorber 20 to act as a secondary heat sink. Photons may arrive and be absorbed at either the absorber 20 or the heat sink 40.

The spatial resolution of the double pixel design is the same as the single pixel design, since the polarity of the signal (voltage) may be evaluated to determine whether the absorber or heat sink absorbed the photon. Pixels can have sizes as small as 10 microns (10 $\mu$m).

The double pixel system requires only a single lead for each pixel. This is an advantage over TES and STJ systems, which both require four leads for each pixel. It simplifies array layout and focal plane area optimization compared to sensors utilizing transition edge sensors or superconducting tunnel junction detectors.

The much higher focal plane array efficiency for a double pixel design is a crucial factor for use in arrays. Because the double pixel system eliminates the need to arrange a devoted heat sink for each absorber, the double pixel system is easily combined with other elements in an array.

In a single pixel design, the heat sink is typically much larger than the absorber in order to increase the signal duration and the voltage amplitude. For the double pixel design, for maximum efficiency, the heat capacity of the absorber is equal to the heat capacity of the heat sink ($C_{abs}=C_{snk}$), and the material and size of the heat sink and absorber are identical. In the double pixel design, the signal duration and voltage amplitude are each ½ of the signal duration and voltage amplitude for a corresponding single pixel design. It can be seen by examining Equations (6), (7), (8), and (9) that there is a greater Johnson noise inherent in the double pixel design. However, the energy fluctuation noise much is higher for the single pixel design, because of the increased heat capacitance of the much larger heat sink, as can be seen by examination of Equation (12). Because the achievable energy resolution (full width half maximum) is determined by the signal to noise ratio, the resolving power of the double pixel design will be approximately equal to that of the single pixel design.

The value of $\tau_K$ determines the maximum counting rate for each detector pixel. For example, for a 1 $\mu$m thick absorber film on a dielectric substrate at a temperature of approximately 0.3 K, $\tau_K$ is shorter than 1 μs. Thus, the counting rates in each pixel can approach $10^6$ per second.

Double Pixel System with Superconducting Bridge

Figure 6A:
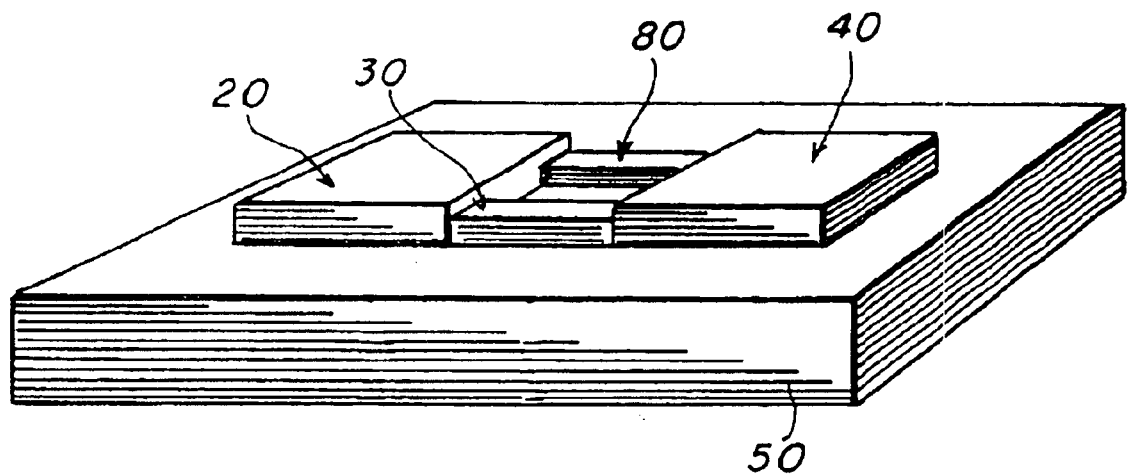
FIG. 6a is an illustration of a double pixel photon detector with a superconducting bridge according to the invention.
Figure 6B:
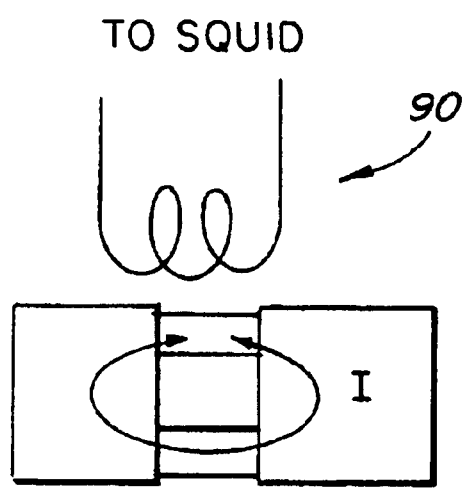
FIG. 6b illustrates the use of double pixel photon detector with a superconducting bridge according to the invention used as an input loop of an flux transformer.

In another embodiment shown in FIG. 6a, a superconducting bridge 80 is added between the heat sink 20 and absorber 40. The superconducting bridge 80 is a strip of superconducting material disposed upon the substrate 50, in contact with the absorber 20 and the heat sink 40, and not in contact with the sensor 30. Neither creating a thermoelectric voltage nor participating in the heat transfer, this superconducting bridge 80 closes a loop for electric current, so current flows from the sensor 30 to the heat sink 40 to the superconducting bridge 80 to the absorber 20, as shown in FIG. 6b. In this embodiment, the loop itself can now serve as an input coil of a flux transformer, inductively coupling itself to the output loop 90 of a SQUID flux transformer located near the current loop. In other words, the signal voltage will produce a magnetic field that can be coupled to a SQUID amplifier circuit. This configuration can lower the overall noise of the system, and increase the signal to noise ratio. There is no need for external leads in this design, making this design very attractive for use in multi-pixel arrays.

Three Dimensional Detector Array

All current single-photon detector arrays operate in two dimensions, that is, they do not take advantage of the third dimension of a dielectric wafer. The novel photon detector array disclosed here is believed to be the first effective use of this third dimension.

It is evident that photon detectors discussed herein may be placed directly on substrates in an array. The signal bandwidth is much larger than the bandwidth of the substrate related phonon noise, therefore, the photon detectors can be placed directly on substrates, thus avoiding "pop-up" or suspended structures in other microbolometer systems. The new arrays will therefore be rugged and not subject to mechanical damage. The need for only one set of electrical leads for each pixel also reduces the difficulties of arranging photon detectors on an array.

Figure 7:
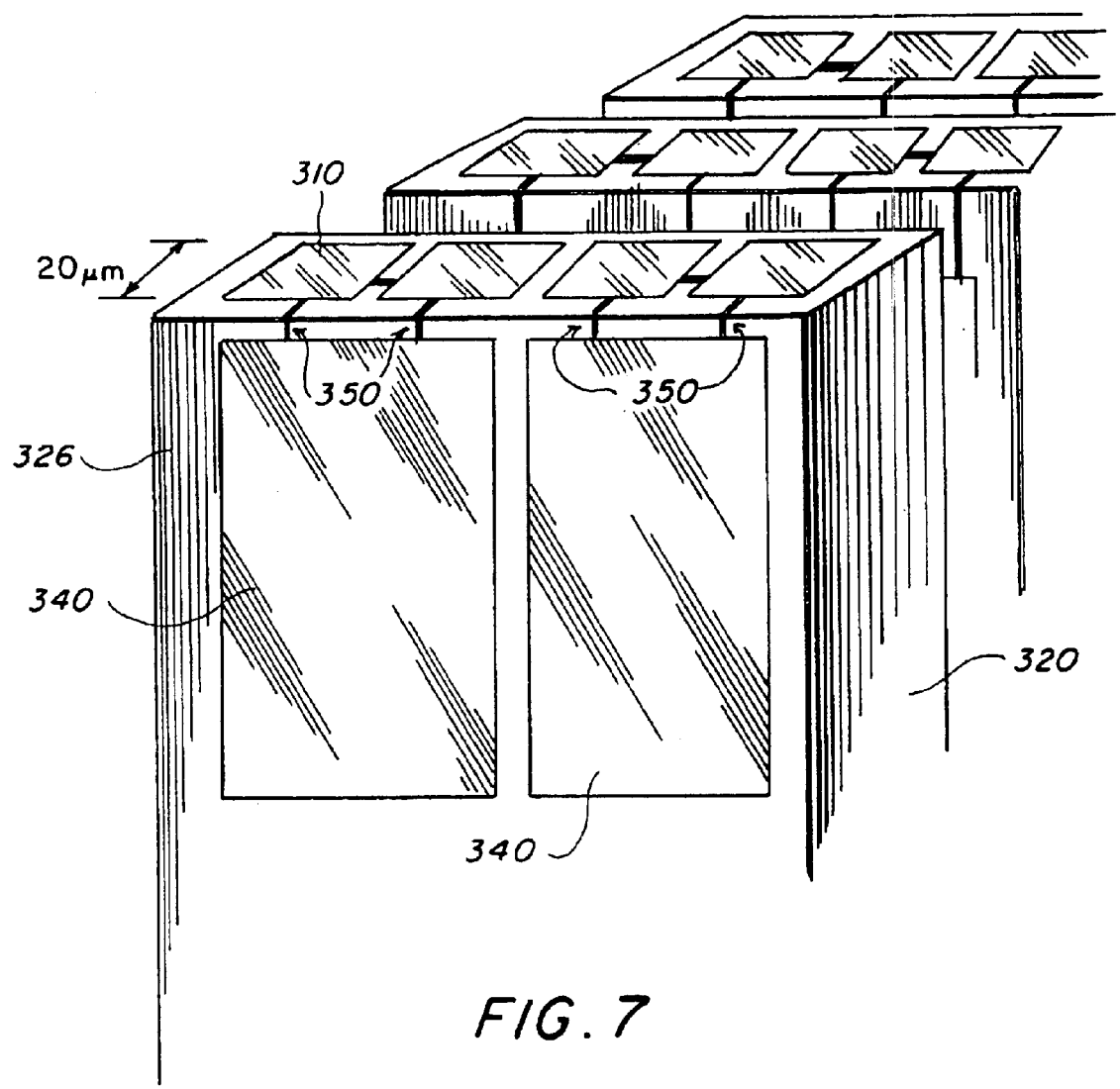
FIG. 7 is an illustration of an array of photon detectors according to the invention.

FIG. 7 illustrates a novel way of mounting the photon detectors on a substrate structure (wafer). The absorbers 310, sensors, and heat sinks are deposed directly on the edge 325 of a substrate structure (wafer) 320. The electronics 340 (including any necessary amplification, analog to digital conversion, signal storage and readout) for an entire row can be integrated onto the side surface 326 of the wafer, so that only a few external connections to one substrate area are required for the electronics 340 on a wafer 320. FIG. 7 illustrates only a few pixels, however, for example, for pixel sizes of 20 μm, 1000 pixels in a row can be placed on a thin wafer 320 only two centimeters (2 cm) in length. When the pixels are placed close together, there is very efficient use of space on the wafer (high "focal plane efficiency").

One alternative is to arrange the absorbers of single pixel arrays on the edge of the wafer and the larger heat sink on the side surface of the array. Other alternatives will be clear to those of skill in the art. This arrangement of components may be used for other types of sensors and electronics. Any type of sensing unit which would benefit from this type of geometry (large exposed array area, ease of construction of leads, three dimensional mounting for processors) may be mounted in this fashion.

One thousand of these wafers can be stacked to form a complete and rugged megapixel detector. Only a single set of electric leads 350 and electronics 340 is needed for a single pixel design or even a double pixel containing an identical absorber and heat sink.

An estimate of the side surface area required for the desired electronics on a wafer with 1000 pixels on the wafer edge is as follows. A SQUID-array amplifier occupies about 100,000 μm², an analog to digital converter suitable for the detector is estimated to occupy about 50,000 μm², and the remaining desired circuitry (trigger, multiplexing, storage, and readout) should occupy no more than 50,000 μm². Therefore, the 500 sets of electronics require about 10 cm², so a wafer 5 cm×2 cm would be sufficient. Single crystalline silicon substrates of 20 micron thickness are commercially available, and are a good choice for this application because standard niobium processing for superconducting electronics for silicon substrates can be utilized.

Demonstrations and Examples of Double Pixel Photon Detectors

In one example, the Sb absorber and an identical Sb heat sink each had dimensions of 18 ×22×0.2 μm. The sensor was 2×26×0.5 μm in dimension, of gold (Au) with 100 ppm iron (Fe) impurities. The leads were superconducting Sn electric leads placed at the far ends of the absorber and heat sink. The energy resolution was 1.5 KeV at 6 KeV input and for T=0.65 K.

Figure 9:
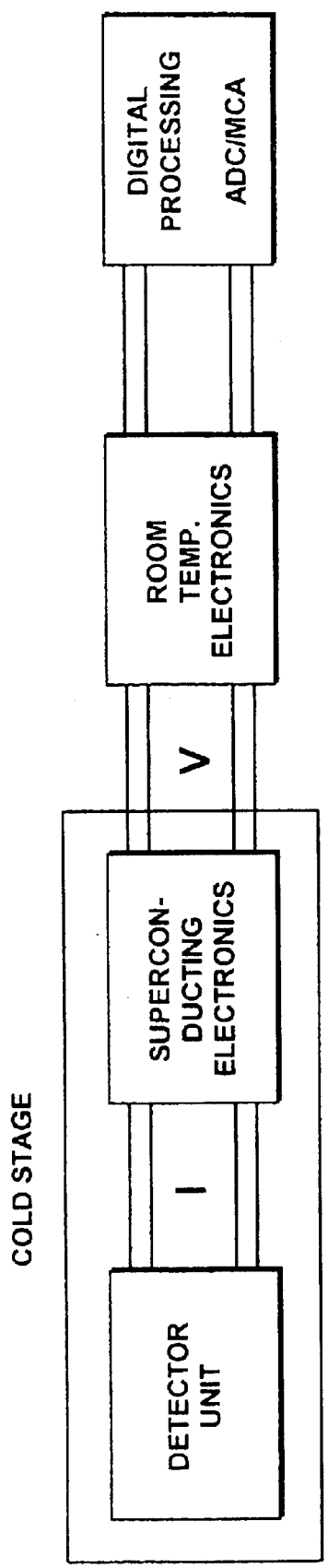
FIG. 9 illustrates the photon detector and electronics configuration for the FIGS. 8a and 8b results.

The electronics, simply illustrated in FIG. 9, were carefully designed for the following: to reduce any parasitic resistances in devices and interconnections; to match the input/output impedances in stage "I" between the detector unit and the superconductor electronics; to ensure the amplifier noise was lower than the output noise level from the SQUID preamplifier in stage "V"; and to optimize the signal acquisition bandwidth.

The resistor of the detector unit was approximately 0.3 Ω, while the duration of the signal was not more than 50 ns. The SQUID amplifier had an inductance of L=0.25 μH so its input impedance Z=Lω was not less than 30 Ω and could have been as large as 100 Ω.

For the Sb absorber and heat sink, $C_{abs}$ is approximately equal to 2 fJ/K. At a temperature of 0.65 K, the signal duration is expected to be about 15 nanoseconds, based on the relationship $\tau_{signal}=(C_{abs}R)/(L_0T)$. This relationship predicts that $\tau_{signal}$ should be about 15 ns, which means that the expected value of signal bandwidth is $\upsilon_B$ approximately 70 MHz and a $\omega=2\pi\upsilon_B=4\times10^8$ radians/sec.

Figure 8A:
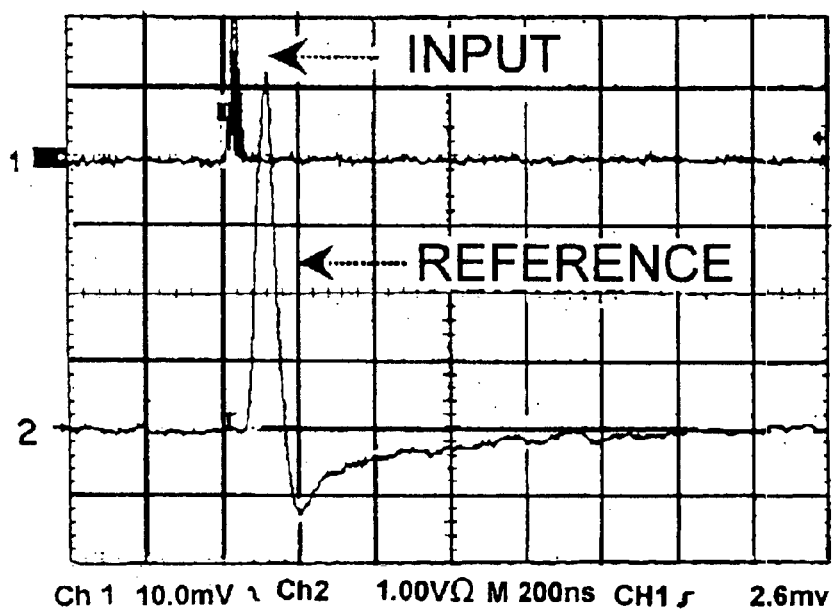
FIGS. 8a and 8b illustrates test results for a photon detector according to the invention subjected to 20 ns laser test pulse input.
Figure 8B:
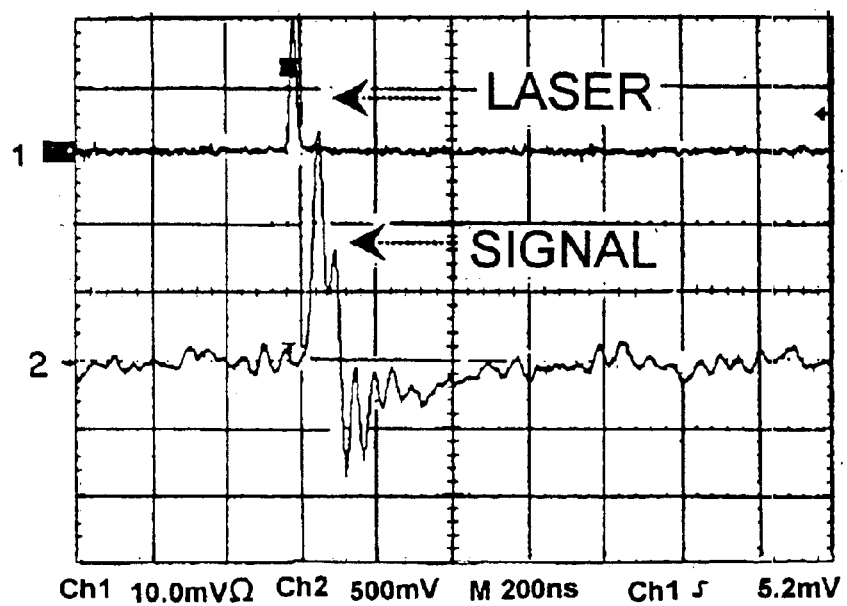

For the test, laser pulses of 20 nanoseconds in duration were shined homogenously onto the device, and the heat sink was shadowed by foil. FIG. 8a illustrates the 20 ns test pulse input and the electronics response. FIG. 8b illustrates the photon detector response to the 20 ns laser pulse.

These test results confirm that the bandwidth $\upsilon_B$ is at least 50 MHz.

Comparing the resistance of the detecting unit $R_{det.unit}$, and Z, it is now clear that at least two or more orders of magnitude in signal amplitude were lost in stage "I" of FIG. 9. Another (one) order of magnitude degradation of S/N was lost at the stage "V", since we used room temperature electronics with input noise of 2 nV/Hz$^{1/2}$.

It should be noted that niobium Nb may be used for the electric leads, and appears to perform better than tin (Sn) leads after several thermal cycles.

In another example, the use of a SQUID array amplifier with an input inductance of 25 nH and room temperature electronics with an input noise of 0.3 nV/Hz$^{1/2}$ was used.

This SQUID array amplifier was a TRW manufactured. The room temperature electronics was a DUPVA gain amplifier discussed in "Innovative products, DUPVA gain amplifier", Photonics Spectra, 33, Issue 33, p. 156 (1999). The lab tests proved that the electronics could be tuned in a rather straightforward manner to make the electronic noise lower than that of the device. The other components (sensor, absorber, and heat sink) were identical to the prior example. The resulting energy resolution was 500 eV at 6 KeV input, even without any additional electronics improvements.

Further improvements may be achieved by adding full custom electronics that matches the device requirements ideally, but for the described results the resolution was actually restricted by the sensor Seebeck coefficient. In the ideal case with an Au—Fe sensor (S~10 $\mu$V/K), the noise of the Au—Fe sensor itself limits the achievable energy resolution to about 20 eV. In our case, S was estimated to be on the order of 1 $\mu$V/K, so if the Fe impurities in the Au sensor were reduced from about 100 to about 10 ppm, some improvement would definitely result.

The greatest improvement (an energy resolution of 1 eV) will be gained by the replacing Au—Fe sensors with (La, Ce)$B_6$ sensors. This would make the use of full custom electronics unnecessary.

In another example, custom designed chips were manufactured using photolithography masks. The 10×10 $\mu$m chip contained 32 absorber-sensor-heat sink devices. The devices on each chip systematically vary a single parameter at a time to allow tests for the optimal configuration. Additional information is contained in G. G. Fritz et al, "Thermoelectric single photon detectors for X-ray/UV radiation", Proc SPIE, Vol 4140 (2000), pp 459–469, incorporated by reference for all purposes.

II. "Anisotropic" Photon Detector

The embodiments of the invention discussed above rely on the Seebeck voltage which is generated across the sensor being parallel in direction to the temperature change in the sensor. However, other photon detector embodiments as disclosed below can incorporate strongly anisotropic conductive materials which have high anisotropic Seebeck coefficients.

It has been found that the inherent properties of some naturally layered materials such as the high-temperature superconductors (HTS) in the normal state cause a transient voltage when a light pulse is absorbed. The amplitude is proportional to the absorbed energy. Observable pulses arise in the HTS materials in the normal state even at room temperature.

The use of these "anisotropic" photon detectors relies on three recent developments in solid state physics.

First is our research into the nonequilibrium $\mu$-potential in layered oxides as a basis for single-particle detection. The signals measured by our group are as described in D. Koller, D. Van Vechten, M. G. Blamire, K. S. Wood, G. G. Fritz, J. S. Horwitz, G. M. Daly, J. B. Thrasher, J. F. Pinto, A. L. Gyulamiryan, V. OH. Vartanyan, R. B. Akopyan, and A. M. Gulian, "Development of a new superconducting detector for the ultra-violet and soft x-ray regimes," *IEEE Trans. Appl. Supercond.*, Vol. 7, pp. 3391–3394, June 1997, the disclosure of which is incorporated by reference.

Second is the development of novel oxide-layered materials, which reveal anomalously high voltage response to laser radiation. See, for example, C. L. Chang, A. Kleinhammes, W. G. Moulton, and L. R. Testardi, "Symmetry-forbidden laser-induced voltages in $YBa_2Cu_3O_7$, Phys. Rev. B,Vol. 41, pp. 11564–11567, June 1990; K. L. Tate, R. D. Johnson, C. L. Chang, E. F. Hilinski, and S. C. Foster, "Transient laser-induced voltages in room-temperature films of $YBa_2Cu_3O_{7-\delta}$," J. Appl. Phys., Vol. 67, pp. 4375–4376, May 1990.; H. S. Kwok, J. P. Zheng, and S. Y. Dong, "Origin of the anomalous photovoltaic signal in Y—Ba—Cu—O," Phys. Rev. B, Vol. 43, pp.6270–6272, March 1991; A. Kleinhammes, C. L. Chang, W. G. Moulton, and L. R. Testardi, "Nonbolometric laser-induced voltage signals in $YBa_2Cu_3O_{7-\delta}$ thin films at room temperature," *Phys*. Rev. B, Vol. 44, pp. 2313–2319, August 1991.; H. Lengfellner, G. Kremb, A. Schnellbogl, J. Betz, K. F. Renk, and W. Prettl, "Giant voltages upon surface heating in normal $YBa_2Cu_3O_{7-\delta}$," Appl. Phys. Lets. Vol. 60, 501 (1992); H, S. Kwok and J. P. Zheng, Phys. Rev. B, Vol. 46, p. 3692 (1992); H. Lengfellner, S. Zeuner, W. Prettl, and K. F. Renk, "Thermoelectric effect in normal-state $YBa_2Cu_3O_{7-\delta}$ films," Europhys. Lett., Vol. 25, pp. 375–378, February 1994.; and L. R. Testardi, "Anomalous laser-induced voltages in $YBa_2Cu_3O_x$, and "off-diagonal" thermoelectricity," Appl. Phys. Lett. Vol. 64, pp. 2347–2349, May 1994, all incorporated herein by reference.

The third direction involves a theoretical understanding of anisotropic thermoelectricity, as discussed in S. L. Korolyuk, I. M. Pilat, A. G. Samoylovich, V. N. Slipchenko, A. A. Snarskii, E. F. Tzar'kov, Sov. Phys. Semicond. 7 (1973) 502, incorporated herein by reference.

It is well known that oxide superconductors have an inherently layered structure. This causes their transport properties within and between the layers to be very different—the anisotropy in the normal state electric conductivity can be $10^4$. Within the crystal unit cell, the high conductivity planes are referred to as the a-b-planes, while the perpendicular direction is called the c-axis. Deposition technology exists to grow these materials with a uniform crystallographic orientation on special (lattice matched) substrates so that the films resemble thin single crystals.

Figure 10:
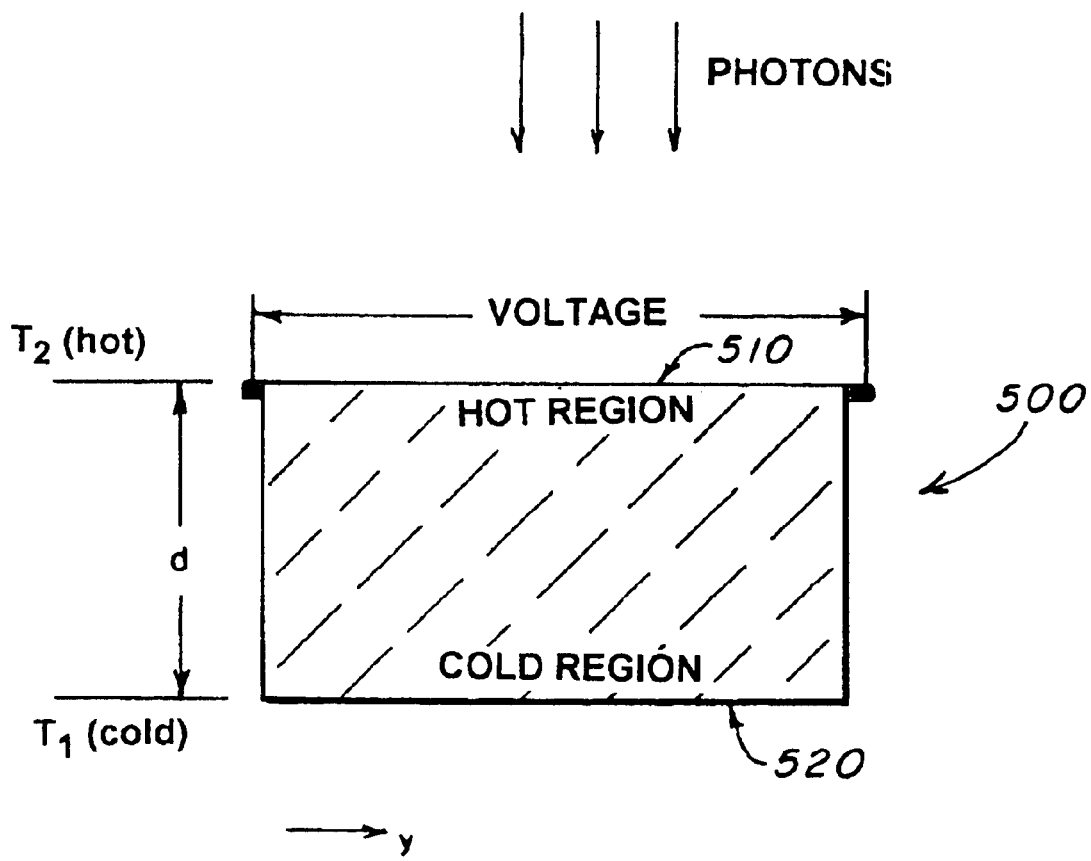
FIG. 10 is an illustration of an anisotropic option of the thermoelectric sensor according to the invention.

In FIG. 10, 500 is a thermoelectric sensor. Consider what happens when the top surface of the sensor 510 is a temperature difference $\Delta T$ warmer than the bottom of the sensor 520. If the material had isotropic properties and the temperature gradient is time independent, a DC voltage would be established across the thickness of the sensor (in z-direction, parallel to the temperature gradient $\Delta T$. The resulting voltage in the Z direction would be:

$$V = \Phi_2 - \Phi_1 = S\Delta T, \quad (15)$$

where $\Phi_2$ is the potential at the top of the sensor, $\Phi_1$ is the potential at the bottom of the sensor, S is the usual Seebeck coefficient and $\Delta T = T_2 - T_1$.

However, in anisotropic materials, the Seebeck coefficient is not a scalar, but is a tensor $S_{ik}$. So, the voltage which develops in an anisotropic thermoelectric sensor as a result of a temperature gradient is:

$$\nabla_k V = \Sigma_m S_{km} \nabla_m T \quad (16)$$

Referring again to FIG. 10, if the thermoelectric sensor element is anisotropic, symmetry will cause the heat flow to be directed perpendicular to the surface of the film (z-direction), since the m=3 (i.e., z) component of $\nabla T$ is non-zero.

A temperature gradient between the top and bottom surfaces of an anisotropic sensor will cause a voltage in the lateral directions perpendicular to the z direction of the temperature gradient. This occurs due to the anisotropic properties of the material, as discussed in the following. In the crystallographic reference frame X', tilted in the (yz)- plane by angle α, the tensor S'$_{km}$ is diagonal: S'$_{YY}$, S'$_{ZZ}$ (not equal to 0), and S'$_{yy}$=S'$_{ZY}$=0. Because the x axis is unchanged between the two reference frames and there is no thermal gradient in that direction, V$_{\|x}$=0. In the measurement frame of reference, the non-diagonal components of the Seebeck tensor also are non-zero. The non-zero value of ($\nabla$T)$_z$, becomes coupled with the S$_{YZ}$ and S$_{zz}$. components. The measurable potential difference along the direction of temperature gradient is of the usual sort for thermoelectricity:

$$V_{\|z}=\{\cos 2\alpha(S'_{zz}-S'_{yy})+(S'_{zz}+S'_{yy})\}(T_1-T_2)/2 \equiv S_{\|z}^{\it eff}\Delta T. \quad (17)$$

and for the y direction, assuming that the ($\nabla$T)$_z$ is constant in the y direction, we get:

$$V_{\|y}=\{(S'_{yy}-S'_{zz}) \sin 2\alpha(\nabla T)_z)L/2 \equiv S_{\|y}^{\it eff}\Delta T(L/d), \quad (18)$$

where d is the thickness of the sensor and L is the length of the sensor. Therefore, a vertical temperature gradient produces a lateral voltage because of the layered anisotropic structure.

Figure 11A:
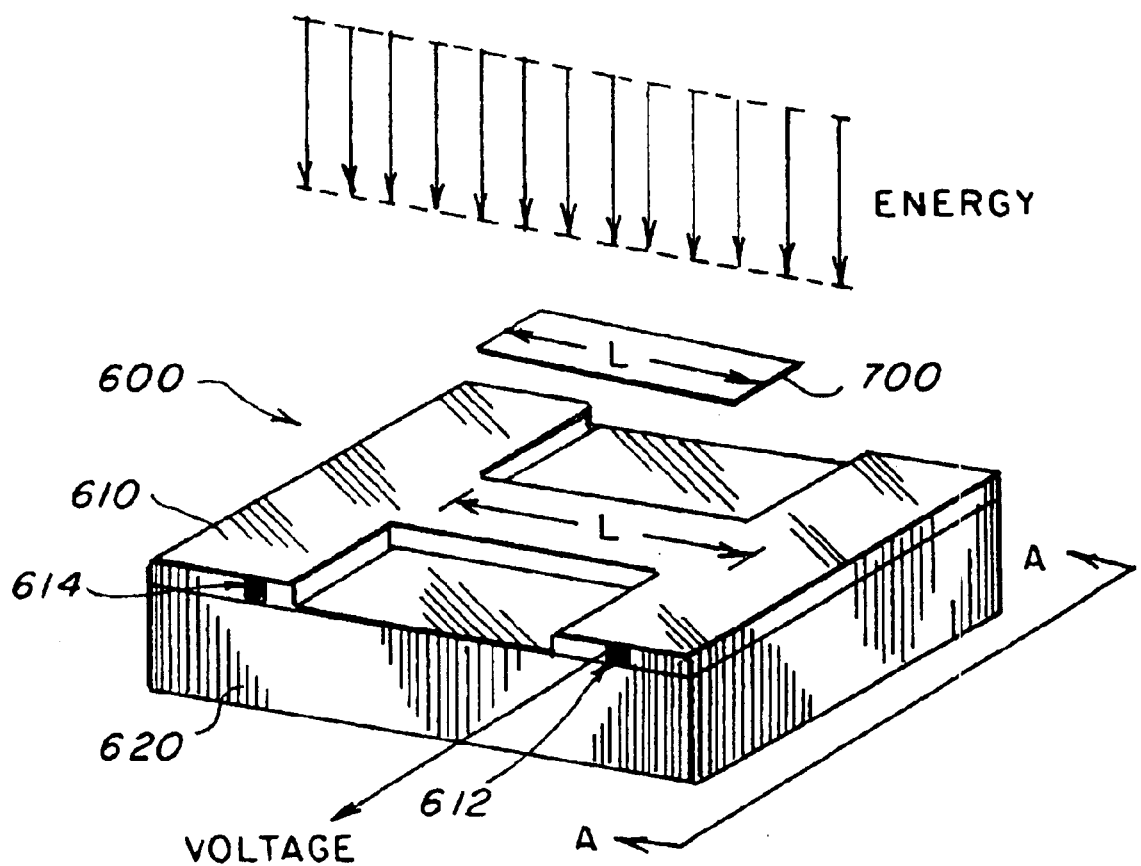
FIG. 11a is a view of a test specimen of a photon detector according to the invention having a sensor (oxide film) disposed upon a substrate.

Refer next to FIG. 11a, which is a view of an embodiment of a photon detector according to the invention. An anisotropic thermoelectric sensor 610 is disposed upon a substrate 620. The sensor 610 is an anisotropic layered superconducting oxide film (YCBO).

Figure 11B:
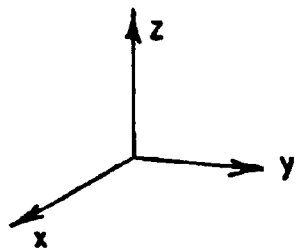
FIG. 11b is an end view of the test specimen including the substrate and oxide film.
Figure 11B:
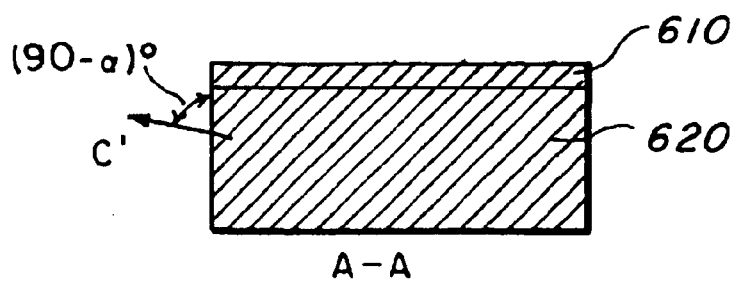

Several test specimens (anisotropic photon detectors) were built and tested. The tests were performed at room temperature (300 K). Each test specimen had a sensor 610, which was an epitaxial thin oxide film YCBO deposited on a dielectric substrate 620. The substrates 620 were commercially available and were special vicinally-cut substrates to produce c axis inclinations of 0.03 degrees, 5 degrees, and 20 degrees, respectively (as measured by 4 circle x-ray diffractometer). A test specimen is illustrated in FIG. 11a and 11b. FIG. 11b is an end view of the substrate 620 and sensor 610 to illustrate the inclination angle cc between the longitudinal axis of the sensor and the ab-plane of the film. Contact pads and electrical leads were attached at the edges of the sensor at points 612 and 614. Notice that the effective length of the sensor L is in the y-direction.

For test purposes, a variable width slit (indicated as 700 in FIG. 11a) was placed between the incident radiation and the detector to ensure that a thin strip-like homogenous quantity of energy was incident upon the surface of the sensor 610. A strip like portion of the sensor 610 was illuminated homogeneously by an energy pulse through a slit with a variable opening. The effective length of the sensor was therefore equal to the length of the area on the sensor which was allowed to be illuminated by the variable width slit.

The operation of the detector is as follows: As photons are received at the top surface of the sensor 610, the top of the sensor begins to increase in temperature. The bottom of the sensor is held at a lower temperature because it is in thermal contact with the cooler substrate 620, which acts as a heat sink. As the difference in temperature between the top and bottom of the sensor 610 increases, a corresponding voltage differential arises across the sensor in the y direction. This voltage differential was measured at points 612 and 614.

Figure 12:
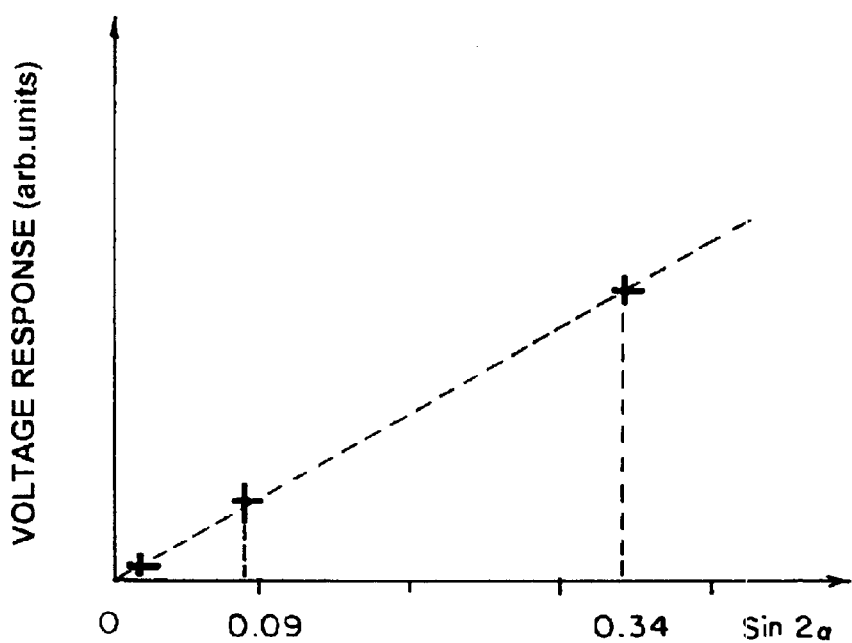
FIG. 12 is a plot of the voltage response for the sensor/substrate combination as a function of the c-axis inclination.

FIG. 12 plots the voltage response for the sensor/substrate combination as a function of the c axis inclination. FIG. 12 also illustrates the linear dependence of maximum output voltage in the y direction on sin 2α, which is expected based on equation (18) above.

Figure 13:
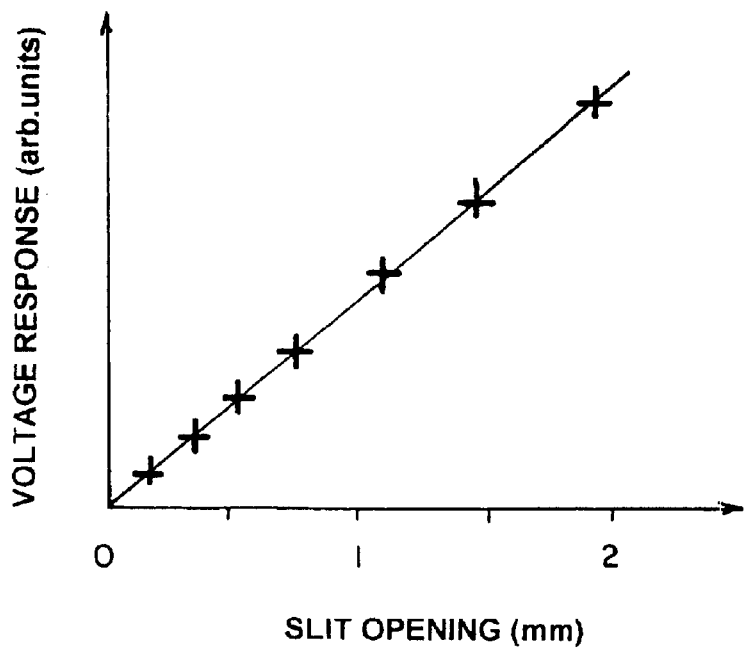
FIG. 13 is a plot plots the voltage response versus the slit opening width at 6 slit widths between 0.2 and 2 millimeters.

The resulting voltage output in the y direction is as shown in FIG. 13, which plots the voltage response versus the slit opening width at 6 slit widths between 0.2 and 2 millimeters.

Note that the maximum voltage is achieved when the slit opening width is equal to the maximum possible effective length in the y direction (i.e. when the maximum area of the sensor is exposed to the radiant energy).

During testing, the amount of incident energy was varied, and the thickness of the film d was varied. The results verified that the amplitude of the voltage is proportional to the temperature gradient ($\nabla$T) between the top and bottom surfaces of the sensor. Experiments with various widths of sensors demonstrated that the amplitude of the voltage signal is independent of the sensor width along the "a" axis of the film (the x axis shown in FIG. 11a).

Figure 14:
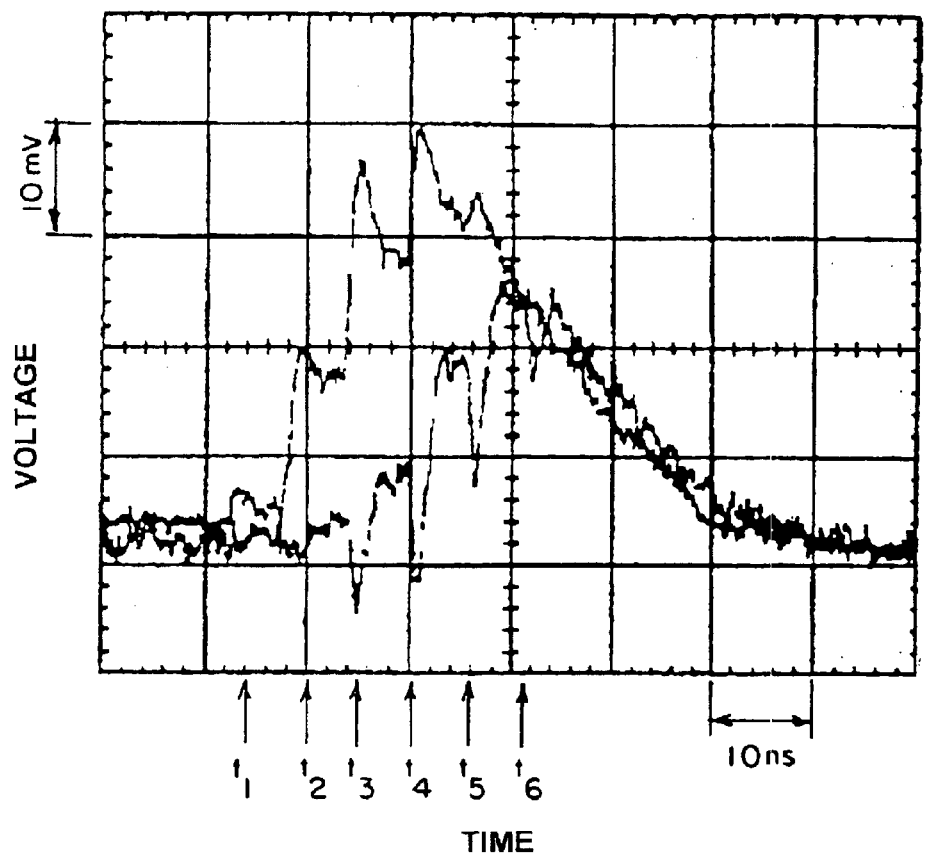
FIG. 14 is a plot of voltage versus time for a photon detector when energy pulses with durations of about 0.1 nanosecond (sub- ns pulses) were directed at the sensor from both the sensor side of the detector and from the substrate side of the detector.

Energy pulses with durations of about 0.1 nanosecond (sub-ns pulses) were directed at the sensor from both the sensor side of the detector and from the substrate side of the detector. The curves in FIG. 14 illustrate the results of these tests. The top curve corresponds to the case when the radiation is incident on the sensor side, and the bottom curve corresponds to the case when the radiation is incident on the substrate side. Looking first at the top curve, the spikes in the curve at times $t_1$, $t_2$, $t_3$, $t_4$, $t_5$, and $t_6$ are the result of the 0.1 ns energy pulses. Notice that the spikes in the top curve are matched by downward spikes in the bottom curve. When energy is incident at the sensor side, there is an upward voltage spike which is the result of a temperature excursion in the sensor that results from the energy pulse. The overall upward trend of the voltage curve between about time $t_1$ and about $t_5$ is the result of a buildup of heat in the sensor, a corresponding overall rise in temperature in the sensor, resulting in an overall output voltage increase during that time period. When the radiation pulses are incident on the substrate side, the temperature in the sensor initially increases in the region closest to the sensor. As a result, the voltage spike across the sensor is of opposite polarity compared to the output voltage across the sensor when the radiation is incident on the top of the sensor. The slow component of the signal (the time period after about $t_6$, when no additional pulses are adding energy to the system, and the sensor gradually is cooled by the substrate) has the same sign for both types of energy deposition. It is therefore clear that the slow component of the signal is related to the heat flow from the sensor 610 into the substrate 620.

The amplitude of the signal in FIG. 14 agrees well with the predicted voltage based on the equation for the V$_{\|y}$ above. At 300 K, a rise in temperature across the sensor of 0.5 to 1 K produces a voltage pulse 10 mV in amplitude in a YCBO thin film sensor with parameters α=5 degrees, d=500 nm, and L=2 mm. The effective Seebeck coefficient S$^{\it eff}$ (S$^{\it eff}$=S'$_{yy}$-S'$_{zz}$) is therefore determined to be approximately 10 µV/K. This is consistent with the values found in the literature for the Seebeck coefficient for YCBO films.

Figure 15:
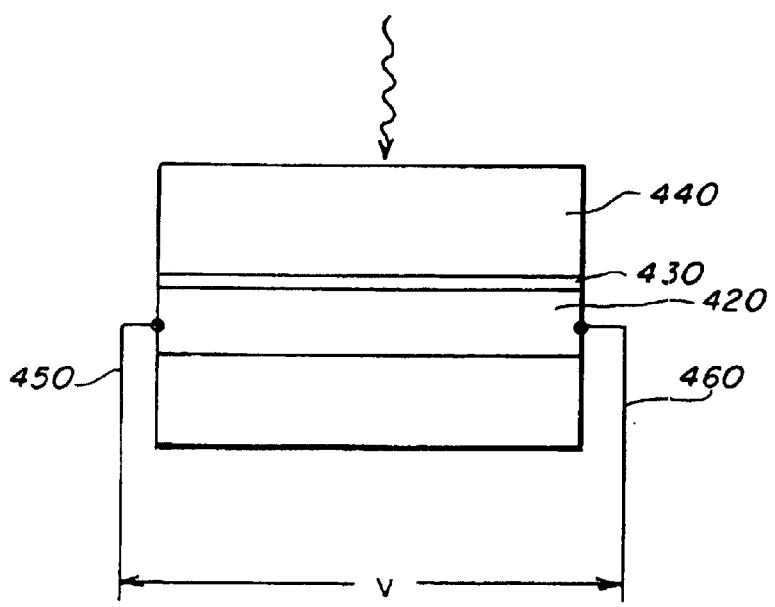
FIG. 15 is a side view of another embodiment of a photon detector having a substrate, a thermoelectric sensor, a very thin electrically-insulating layer, and a metal absorber.

Refer now to FIG. 15, which is a side view of another embodiment of a photon detector according to the invention. The anisotropic thermoelectric sensor 420 is disposed upon a dielectric substrate 410. An insulating barrier 430 is disposed over the anisotropic thermoelectric sensor 420, and an absorber 440 is disposed on the insulating barrier 430. As discussed previously, the dielectric substrate 410 acts as a heat sink. The absorber 440 is a normal metal that is used to absorb the incident radiation. The sensor 420 is a superconductor.

The absorber 440 is designed with a volume V$_{abs}$ which is optimized to absorb the incident photons, and to stop them from traveling further into the detector. Since the absorber 440 is a normal-metal film of a restricted geometry, with a typical size of 10 µm×10 µm×1 µm, the electron temperature homogenization within the absorber is a fast process, usually being considered as "instantaneous". Another very useful function of the absorber is regulation of the heat transfer. After the electron temperature homogenization within the absorber, the excess energy in the absorber is transferred to the sensor through an insulating barrier. The primary function of the barrier is to prevent the metallic absorber from shorting out the signal in the sensor underneath.

Note that the insulating barrier is not necessary if the absorber is a material which does not conduct electricity. So another embodiment would include only an non-conductive absorber without an insulating layer.

As the photons are received at the top of the sensor, the sensor begins to increase in temperature. The bottom of the sensor is held at a lower temperature by the substrate, which acts as a heat sink. As the difference in temperature between the top and bottom of the sensor increases, a corresponding voltage differential arises across the sensor in the lateral direction. Contact pads and electrical leads 450 and 460 are attached to the ends of the anisotropic thermoelectric sensor 420 to enable voltage measuring electronics to measure the voltage generated across the sensor 420. Typically, the voltage generated across the sensor is large, so SQUID amplification is not necessary in order to effectively measure the voltage.

The large voltage across the sensor is explained as follows:

For a sensor with an effective length L in the longitudinal direction and a thickness d in the transverse direction (the direction parallel to the thermal gradient), the voltage generated in the longitudinal direction $V_L$ is much greater than the voltage generated in the transverse direction $V_t$, and can be represented by $V_L=V_t(L/d)$. Since L is typically much larger than d (for example L=200 $\mu$m, d=0.1 $\mu$m, L/d=2000). In addition, optimally, the longitudinal axis of the sensor will match the direction in which the Seebeck coefficient is largest.

The time dependent temperature excursion $\delta T=T^*-T$, has its maximum value $\delta T_{max}=Q/C_{abs}$, where $C_{abs}$ is the heat capacity of the absorber, and Q is deposited energy. The heat-sink (substrate) stays at temperature T. The heat diffuses from the absorber to the heat sink via the thermoelectric sensor. This energy flux in the thermoelectric sensor creates the voltage signal V(t) that lasts approximately a time $\tau_{signal}$, where $$\tau_{signal}=C_{abs}/G, \quad (19)$$

where G is the thermal conductance via the thermoelectric sensor and its interfaces with the absorber and the substrate.

For even so long a time as 10 $\mu$s-duration time scale, the main role in heat conduction may be played by hot electrons, while the phonons are inefficient. This desirable result may be produced either by lowering the bias temperature (so the rate of electron inter-collisions $\gamma_{e-e}$ (proportional to $T^2/\epsilon_F$) becomes higher than the rate of electron phonon collisions $\gamma_{e-ph}$ (proportional to $T^3/\Omega_D^2$)), or by the particular choice of absorber materials. Note that in transition metals, such as tungsten, even at T≧4 K, $\gamma_{e-e}>>\gamma_{e-ph}$, so transition metals are a good choice for absorber.

In another embodiment of the invention, no absorber or barrier are used. This is particularly useful for incident radiation in the UV range, due to the rapid and nearly complete absorption of UV radiation by the uppermost region of the sensor.

If, of course, the voltage can be time integrated, the pulse duration is not as important. Indeed, in the vertical stack geometry of FIG. 15, heat has no other way to go than through the sensitive element. In this case, one can evoke the Fourier law to couple the $\nabla T$ with the value of $J_H$, the energy (heat) flux through the sensor, $J_H=-k_{eff}\nabla T$, where $k_{eff}$ is the effective heat conductivity (electron, phonon, etc) of the sensor. As discussed further in A. M. Gulian et al, "Imaging Detectors Based on the Response of Anisotropic Layered Materials", IEEE Trans App Supercond, the time integral of the generated voltage is equal to $$\int V(t)dt=\{S^{eff}(L/d)\}(Q/G), \quad (20)$$

and is independent of the absorber heat capacity. Because the time integral of the generated voltage is proportional to the value of the deposited energy Q, it is clear that the device may be used to characterize the energy.

For cryogenic photon detectors, the substrate should be maintained at a low operating temperature T in order to reduce the thermal capacity of the absorber and the thermal fluctuations between the detector components. The sensor must be a material in which the Seebeck coefficient is highly anisotropic at cryogenic temperatures. Detectors which operate at cryogenic operating temperatures (below 1 K) will have very low noise, and extremely high signal to noise resolution, so are very desirable for detecting single photons. In single photon detection systems designed for use at cryogenic temperatures, superconducting leads and SQUIDS will also be useful for lower the system noise and measuring the voltage response.

Materials which have good properties at cryogenic temperatures are certain $La_2CuO_{4+\delta}$ materials. $La_{2-x}Ba_xCuO_4$ shows similar behavior at cryogenic temperatures. At cryogenic temperatures, using either of these materials as the anisotropic thermoelectric sensor is expected to greatly increase the energy resolution, and enable the photon detectors detect single photons. Material properties are discussed further in D. Van Vechten, K. S. Wood, G. G. Fritz, J. Horwitz, A. L. Gyulamiryan, A. Kuzanyan, V. Vartanyan, and A. M. Gulian, "Imaging Detectors based on anisotropic thermoelectricity", Nuclear Instruments and Methods in Physics Research section A, 444 (2000) 42–45; M. Cassart, E. Grivery, J. P. Isii, E. Ben Salem, B. Chevalier, C. Brisson, A. Tressaud, Physica C 213 (1993) 327; S. I. Uchida, H. Takagi, H. Ishii, H. Eisaki, T. Yabe, Tajima, S. Tanaka, Jpn A. Appl. Phys 26, (1987) L440; M. Cassart, J. P. Issi, in: D. M. Rove (Ed.), CRC Handbook of Thermoelectrics, CRC Press, Washington, D.C., 1994, p. 358, all incorporated herein by reference.

The above embodiments are provided for illustration of the invention. Many different embodiments within the scope of this invention will be clear to those of skill in the art. Reference should be made to the appended claims for the scope of the invention described herein.

What is claimed is:

1. A detector for detecting a photon, comprising:
   a substrate,
   a photon absorber disposed upon said substrate,
   a thermoelectric sensor, disposed upon said substrate and thermally coupled with said photon absorber, and
   a heat sink disposed upon said substrate, thermally coupled to the thermoelectric sensor,
   for absorbing a photon and generating a voltage differential across said sensor between said absorber and said heat sink in response to said photon absorption.

2. The detector of claim 1, further comprising means to measure said voltage differential.

3. The detector of claim 2, further comprising superconducting leads for measuring said voltage differential.

4. The detector of claim 3, further comprising an input coil of a flux transformer electrically connected to said superconducting leads.

5. The detector of claim 3, further comprising an input coil of a flux transformer of a superconducting quantum interference device circuit electrically connected to said superconducting leads.

6. The detector of claim 1, wherein said substrate comprises a dielectric material.

7. The detector of claim 1, wherein responsive to arrival of said photon, said absorber is heated, so that heat in said absorber is transferred to said sensor and further transferred to said heat sink.

8. The detector of claim 1, wherein said heat is transferred from said absorber to said heat sink faster than heat is transferred from said absorber to said substrate.

9. The detector of claim 8, wherein the time for said heat to be transferred from said absorber to said heat sink is about ten times less than the time for heat to be transferred from said absorber to said substrate.

10. The detector of claim 1, wherein the absorber and the heat sink have the same heat capacity.

11. The detector of claim 10, wherein the absorber and the heat sink are alike in material and geometry.

12. The detector of claim 1, wherein said thermoelectric sensor comprises a thin film disposed upon said substrate.

13. The detector of claim 12, wherein said thin film comprises gold with impurities.

14. The detector of claim 12, wherein said thin film comprises gold with iron impurities between about 10 ppm and 100 ppm.

15. The detector of claim 12, wherein said thin film comprises a metal with a Seebeck coefficient of at least about 10 $\mu$V/K at an operating temperature of said detector.

16. The detector of claim 12, wherein said thin film comprises a metal with a Seebeck coefficient of between about 10 $\mu$V/K and about 80 $\mu$V/K at an operating temperature of said detector.

17. The detector of claim 12, wherein said thin film comprises lanthanum cerium hexaboride.

18. A photon detector as in claim 12, wherein said thin film comprises CeNiSn.

19. The detector of claim 1, wherein said thermoelectric sensor comprises a material with isotropic thermoelectric properties.

20. The detector of claim 1, further comprising a superconducting element electrically coupled to the heat sink and the photon absorber.

21. The detector of claim 1, further comprising said sensor connected between said absorber and said heat sink.

22. The detector of claim 1, further comprising niobium electric leads attached to said heat sink and to said absorber for measuring said voltage differential.

23. The detector of claim 1, wherein said sensor has a resistance R which is less than $r_0 L_0 / T^2 A_{abs}$, where $r_0$ is the Kapitza resistance constant between the absorber and the substrate, $L_0$ is the Lorenz number, T is the operating temperature of the detectors and $A_{abs}$ is the cross sectional area of the absorber.

24. The detector of claim 23, wherein said $r_0$ is about 20 $K^4$ cm$^2$, W and said $L_0$ is about 25 nW-$\Omega$K$^2$.

25. A photon detector comprising:

a thin dielectric wafer having a photon absorber disposed on the edge of said wafer, a thermoelectric sensor disposed on said wafer, and a heat sink disposed on said wafer, wherein said thermoelectric sensor is thermally coupled with said photon absorber, said heat sink is thermally coupled to said thermoelectric sensor, for absorbing a photon and generating a potential across said sensor, whereby there is a voltage differential between said absorber and said heat sink in response to said photon absorption.

26. The photon detector of claim 25, wherein said heat sink and said thermoelectric sensor are disposed on the edge of said wafer.

27. The photon detector of claim 26, further comprising a voltage differential measuring means disposed upon a face of said wafer.

28. The photon detector of claim 27, wherein said voltage differential measuring means comprises a SQUID array amplifier.

29. The photon detector of claim 28, wherein said voltage differential measuring means comprises semiconductor electronics.

* * * * *